US008946730B2

(12) United States Patent
Okumoto et al.

(10) Patent No.: US 8,946,730 B2
(45) Date of Patent: Feb. 3, 2015

(54) THIN-FILM TRANSISTOR DEVICE AND METHOD FOR MANUFACTURING SAME, ORGANIC ELECTROLUMINESCENT DISPLAY ELEMENT, AND ORGANIC ELECTROLUMINESCENT DISPLAY DEVICE

(71) Applicant: Panasonic Corporation, Osaka (JP)

(72) Inventors: Yuko Okumoto, Osaka (JP); Akihito Miyamoto, Osaka (JP); Takaaki Ukeda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/968,556

(22) Filed: Aug. 16, 2013

(65) Prior Publication Data
US 2013/0328034 A1 Dec. 12, 2013

Related U.S. Application Data

(63) Continuation of application No. PCT/JP2012/005999, filed on Sep. 21, 2012.

(30) Foreign Application Priority Data

Nov. 14, 2011 (JP) ................................ 2011-248807

(51) Int. Cl.
H01L 27/15 (2006.01)
H01L 21/00 (2006.01)
(Continued)

(52) U.S. Cl.
CPC ...... H01L 29/78693 (2013.01); H01L 27/3274 (2013.01); H01L 51/105 (2013.01);
(Continued)

(58) Field of Classification Search
CPC ... H01L 25/0753; H01L 27/12; H01L 27/156; H01L 27/1214; H01L 27/3211; H01L 29/66757; H01L 25/167; H01L 33/62; H01L 33/486

USPC ........ 438/28, 34, 35, 161; 257/80–82, 88, 89, 257/E51.022; 313/498, 505, 506
See application file for complete search history.

(56) References Cited

U.S. PATENT DOCUMENTS 5,443,922 A 8/1995 Nishizaki et al. ............. 428/690
7,772,622 B2 8/2010 Fujimori et al.
(Continued)

FOREIGN PATENT DOCUMENTS

JP 5-163488 6/1993
JP 2004-335851 11/2004
(Continued)

OTHER PUBLICATIONS

United States office action, mailed Jun. 16, 2014, in U.S. Appl. No. 13/968,567.
(Continued)

Primary Examiner — Hsien Ming Lee
(74) Attorney, Agent, or Firm — Greenblum & Bernstein, P.L.C.

(57) ABSTRACT

In a thin film transistor device, partition walls define first, second, and third apertures. In plan view, at a bottom portion of the first aperture, a center of a total of areas of a source electrode portion and a drain electrode portion is offset from a center of area of the bottom portion in a direction differing from a direction of the third aperture, and at a bottom portion of one of the first and second apertures, a center a total of areas of a source electrode portion and a drain electrode portion is offset from a center of area of the bottom portion in a direction differing from a direction of the other one of the first and second apertures.

13 Claims, 14 Drawing Sheets

(51) Int. Cl.
*H01L 29/786* (2006.01)
*H01L 27/32* (2006.01)
*H01L 51/10* (2006.01)
*H01L 27/12* (2006.01)
*H01L 29/66* (2006.01)
*H01L 51/52* (2006.01)
*H01L 51/05* (2006.01)

(52) U.S. Cl.
CPC ........ *H01L27/1225* (2013.01); *H01L 27/1292* (2013.01); *H01L 29/66742* (2013.01); *H01L 51/52* (2013.01); *H01L 27/3262* (2013.01); *H01L 51/0545* (2013.01); *H01L 27/3248* (2013.01)
USPC ................ 257/81; 257/82; 438/34; 438/161; 313/498; 313/505

(56) References Cited

U.S. PATENT DOCUMENTS

| | | | | |
|---|---|---|---|---|
| 8,018,540 | B2* | 9/2011 | Shin et al. | 349/38 |
| 8,729,534 | B2 | 5/2014 | Yoshida et al. | |
| 2007/0109457 | A1 | 5/2007 | Song et al. | |
| 2007/0117298 | A1 | 5/2007 | Fujimori et al. | 438/198 |
| 2007/0166855 | A1 | 7/2007 | Lee et al. | 438/29 |
| 2009/0224664 | A1 | 9/2009 | Yoshida et al. | 313/504 |
| 2011/0014389 | A1 | 1/2011 | Ito | |
| 2011/0254003 | A1 | 10/2011 | Tsuzuki et al. | 257/57 |
| 2013/0328033 | A1 | 12/2013 | Okumoto et al. | 257/40 |
| 2013/0328034 | A1 | 12/2013 | Okumoto et al. | |
| 2013/0328035 | A1 | 12/2013 | Okumoto et al. | 257/40 |
| 2013/0334513 | A1 | 12/2013 | Okumoto et al. | 257/40 |
| 2014/0034933 | A1 | 2/2014 | Okumoto et al. | 257/40 |
| 2014/0042417 | A1 | 2/2014 | Okumoto et al. | 257/40 |
| 2014/0042419 | A1 | 2/2014 | Okumoto et al. | 257/40 |

FOREIGN PATENT DOCUMENTS

| | | |
|---|---|---|
| JP | 2007-88471 | 4/2007 |
| JP | 2007-142305 | 6/2007 |
| JP | 2008-227141 | 9/2008 |
| JP | 2008-288313 | 11/2008 |
| JP | 2009-76791 | 4/2009 |
| JP | 2009-272523 | 11/2009 |
| JP | 2010-93093 | 4/2010 |
| WO | 2008/149498 | 12/2008 |
| WO | 2010/058662 | 5/2010 |
| WO | 2011/132215 | 10/2011 |
| WO | 2012/035281 | 3/2012 |

OTHER PUBLICATIONS

International Search Report and Written Opinion of PCT/JP2012/005999, mailing date is Dec. 11, 2012, together with English translation of ISR.
International Search Report and Written Opinion of PCT/JP2012/006007, mailing date is Dec. 4, 2012, together with English translation of ISR.
International Search Report and Written Opinion of PCT/JP2012/006000, mailing date is Dec. 11, 2012, together with English translation of ISR.
International Search Report and Written Opinion of PCT/JP2011/003549, mailing date is Sep. 20, 2011, together with English translation of ISR.
International Search Report and Written Opinion of PCT/JP2012/005996, mailing date is Dec. 11, 2012, together with English translation of ISR.
Office Action (Notice of Allowance) in U.S. Appl. No. 13/968,559, dated Sep. 17, 2014.
International Search Report and Written Opinion of PCT/JP2011/003547, mailing date is Sep. 20, 2011, together with English translation of ISR.
International Search Report and Written Opinion of PCT/JP2012/005995, mailing date is Dec. 4, 2012, together with English translation of ISR.

* cited by examiner

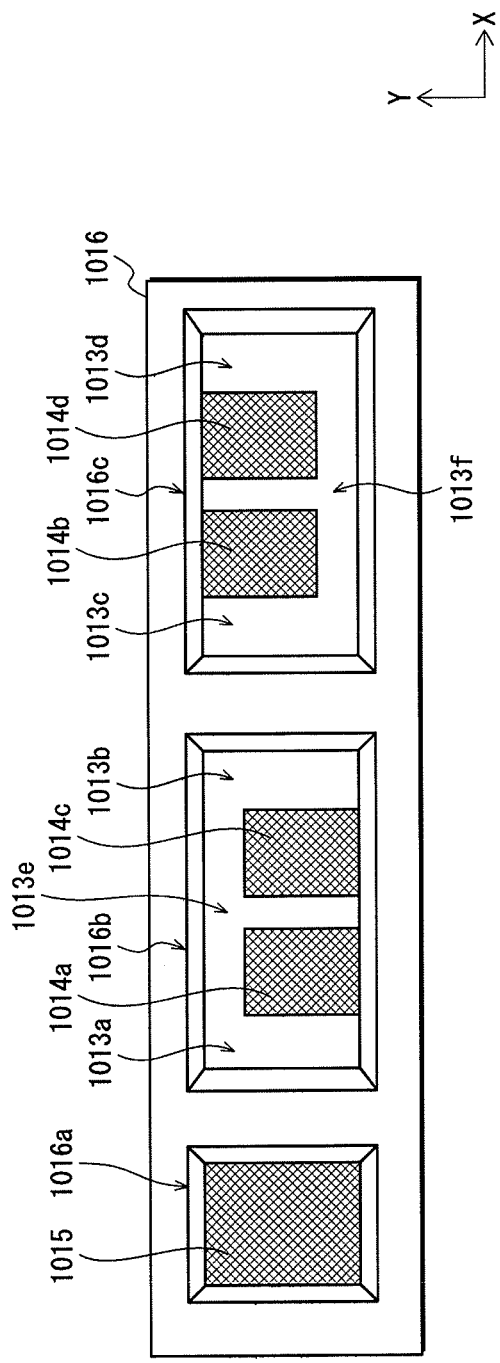
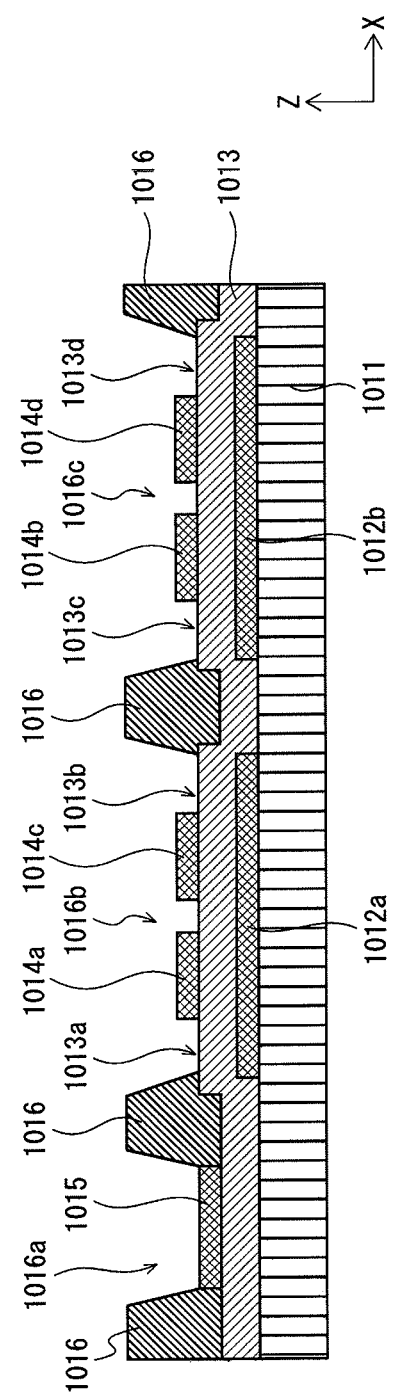
FIG. 3A
FIG. 3B

FIG. 4A

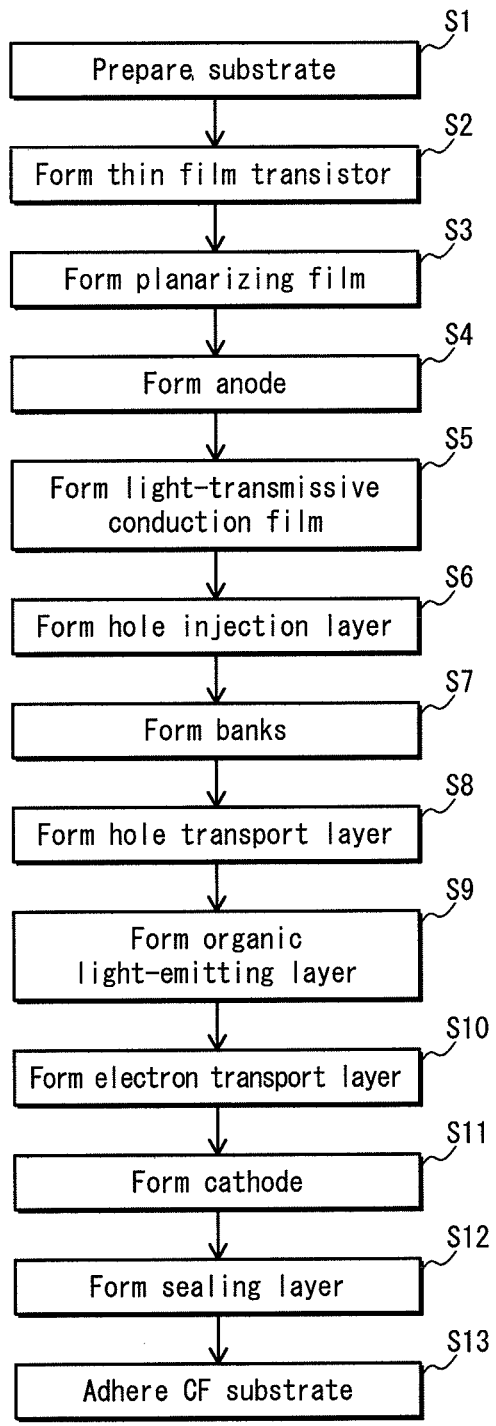

- S1 Prepare substrate
- S2 Form thin film transistor
- S3 Form planarizing film
- S4 Form anode
- S5 Form light-transmissive conduction film
- S6 Form hole injection layer
- S7 Form banks
- S8 Form hole transport layer
- S9 Form organic light-emitting layer
- S10 Form electron transport layer
- S11 Form cathode
- S12 Form sealing layer
- S13 Adhere CF substrate

FIG. 4B

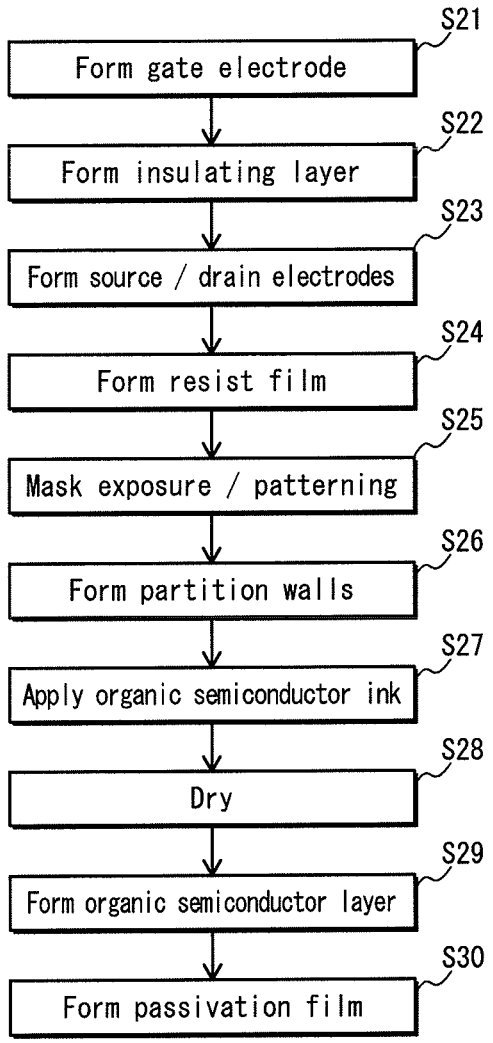

- S21 Form gate electrode
- S22 Form insulating layer
- S23 Form source / drain electrodes
- S24 Form resist film
- S25 Mask exposure / patterning
- S26 Form partition walls
- S27 Apply organic semiconductor ink
- S28 Dry
- S29 Form organic semiconductor layer
- S30 Form passivation film

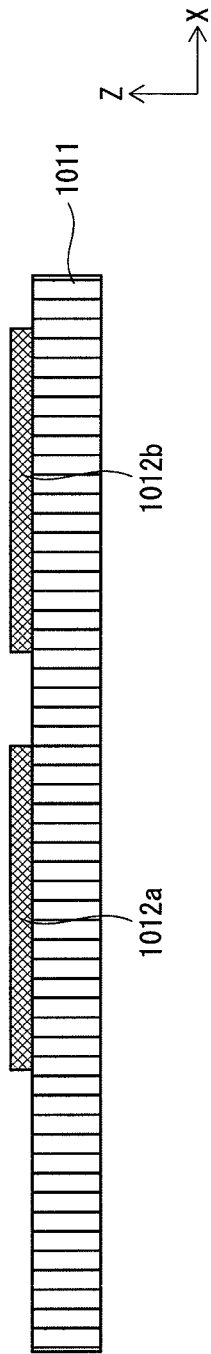
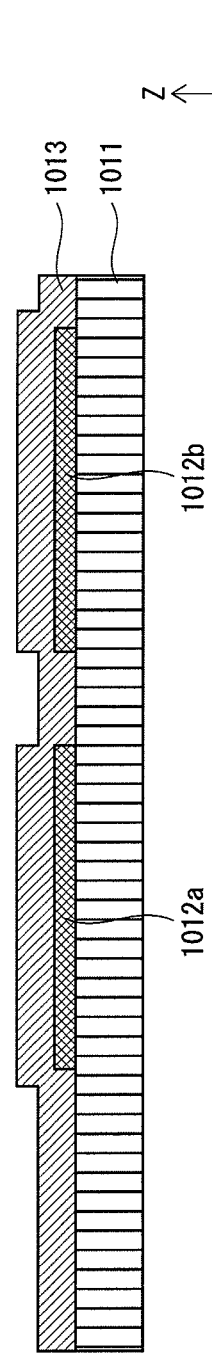
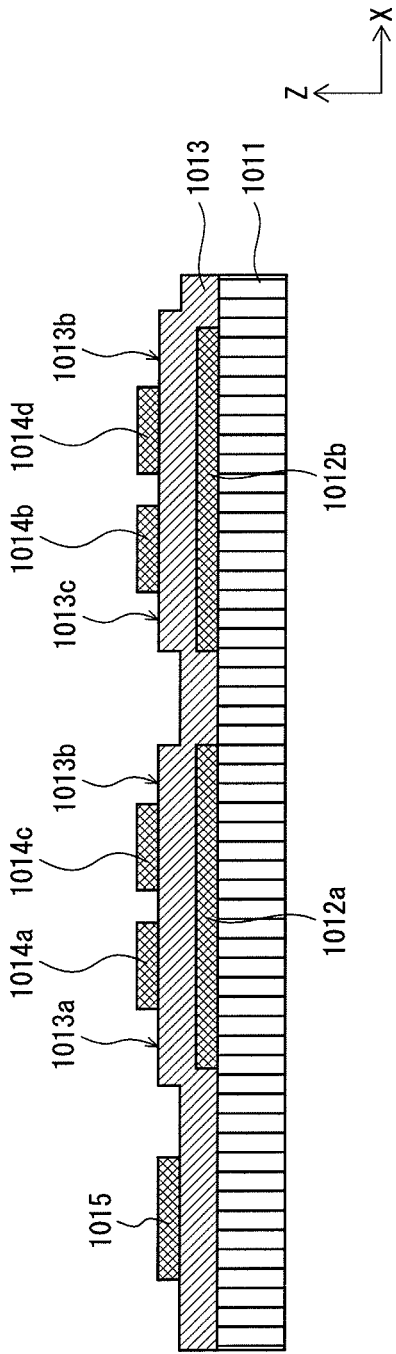

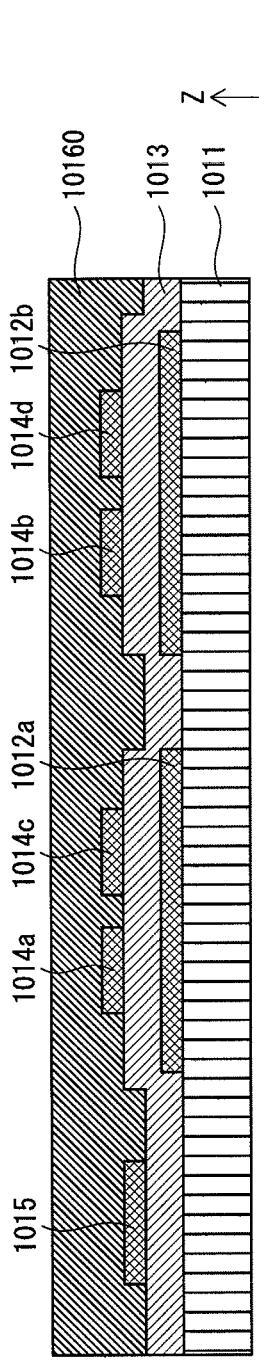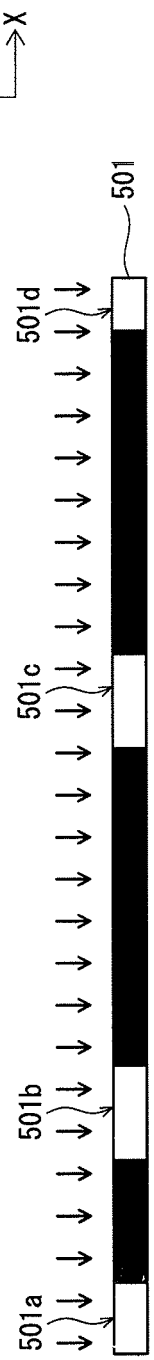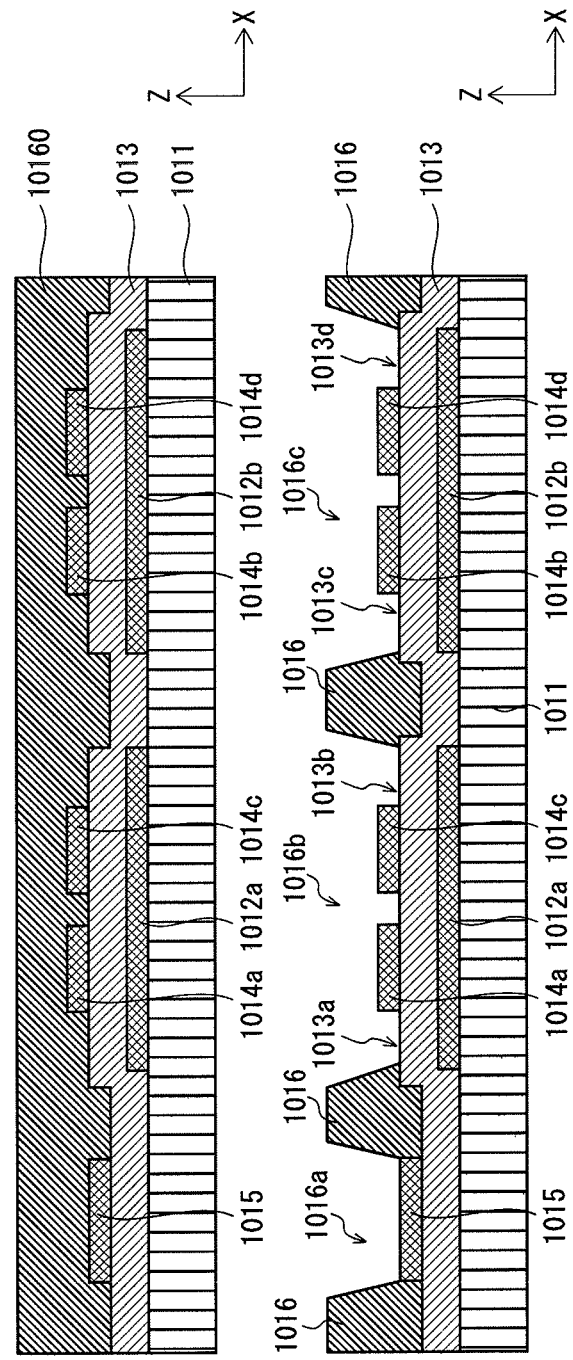

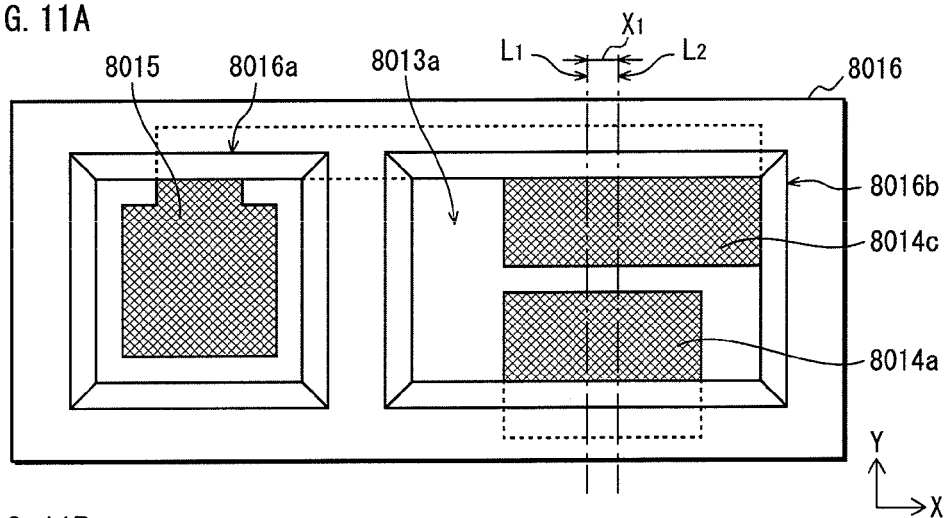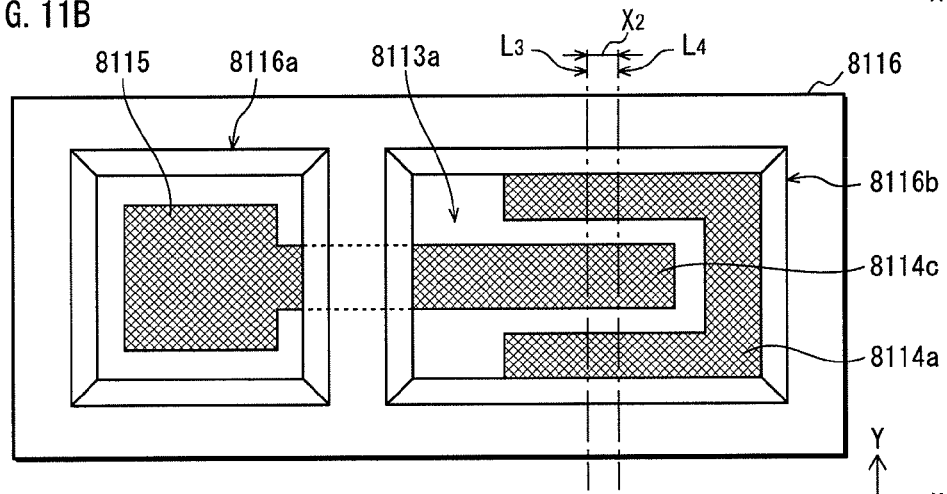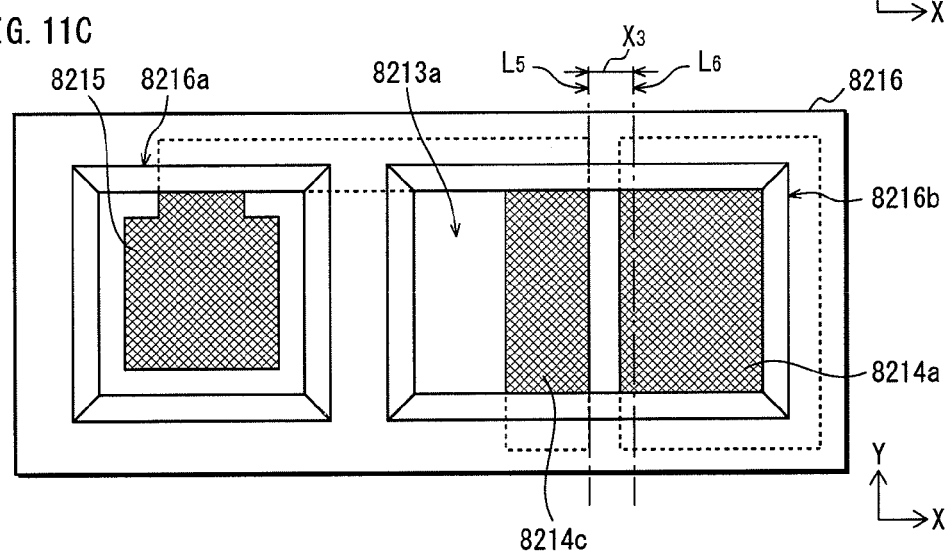

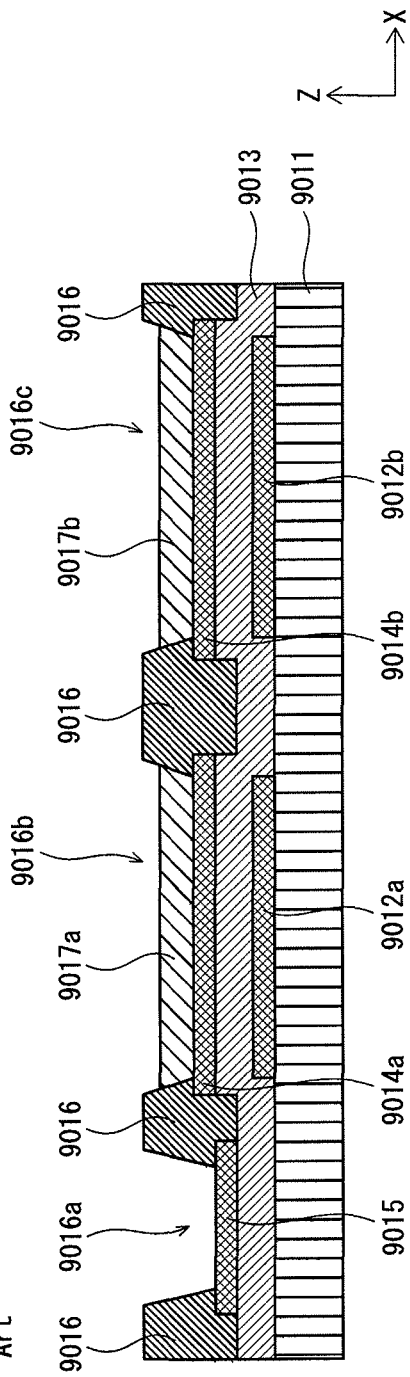
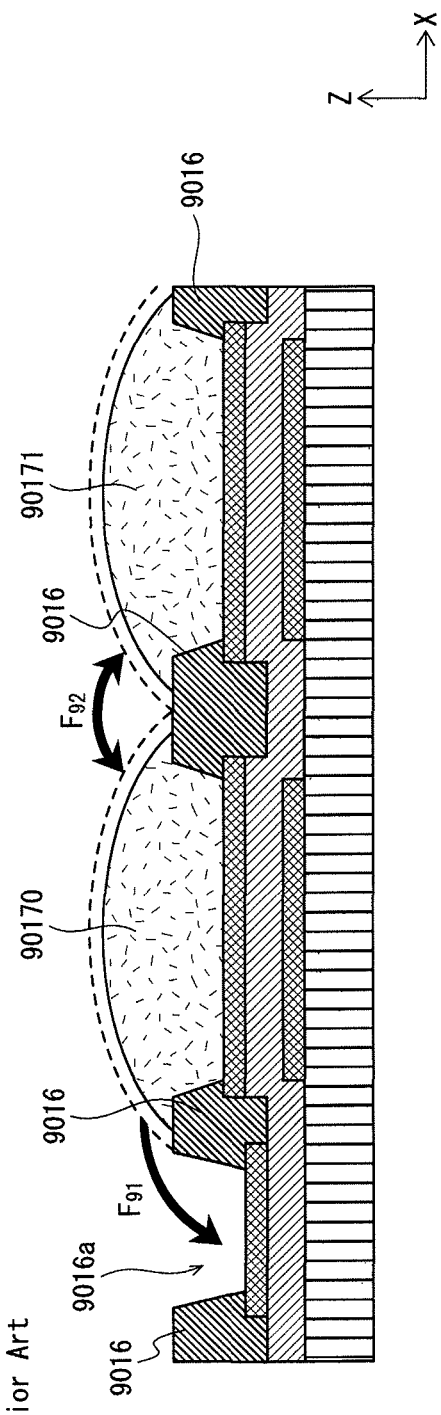

US 8,946,730 B2

THIN-FILM TRANSISTOR DEVICE AND METHOD FOR MANUFACTURING SAME, ORGANIC ELECTROLUMINESCENT DISPLAY ELEMENT, AND ORGANIC ELECTROLUMINESCENT DISPLAY DEVICE

CROSS REFERENCE TO RELATED APPLICATION

This is a continuation application of PCT Application No. PCT/JP2012/005999 filed Sep. 21, 2012, designating the United States of America, the disclosure of which, including the specification, drawings and claims, is incorporated herein by reference in its entirety.

TECHNICAL FIELD

The present disclosure relates to a thin film transistor device and a manufacturing method thereof, an organic EL display element, and an organic EL display device.

DESCRIPTION OF THE RELATED ART

In liquid crystal display panels and organic EL display panels, control of light emission is performed in units of subpixels. To make this possible, thin film transistor devices are used in liquid crystal display panels and organic EL display panels. A thin film transistor device includes a thin film transistor (TFT) element formed for each subpixel. In particular, development is in progress of a thin film transistor device that includes a semiconductor layer formed by using organic semiconductor material.

As illustrated in FIG. 14A, a conventional organic TFT device includes, for instance: a substrate 9011; gate electrodes 9012a, 9012b; an insulating layer 9013; source electrodes 9014a, 9014b; drain electrodes (undepicted); and organic semiconductor layers 9017a, 9017b. The gate electrodes 9012a, 9012b, the insulating layer 9013, the source electrodes 9014a, 9014b, the drain electrodes, and the organic semiconductor layers 9017a, 9017b are formed by being layered one on top of another in the stated order on the substrate 9011. The organic semiconductor layers 9017a, 9017b are formed by applying organic semiconductor ink onto the insulating layer 9013 and by drying the applied organic semiconductor ink. The organic semiconductor layer 9017a is formed so as to fill the gap between the source electrode 9014a and the corresponding drain electrode and cover the source electrode 9014a and the corresponding drain electrode. Similarly, the organic semiconductor layer 9017b is formed so as to fill the gap between the source electrode 9014b and the corresponding drain electrode and cover the source electrode 9014b and the corresponding drain electrode.

In addition, as illustrated in FIG. 14A, partition walls 9016 are formed on the insulating layer 9013. The partition walls 9016 partition the organic semiconductor layer 9017a belonging to a first thin film transistor element from the organic semiconductor layer 9017b belonging to a second thin film transistor element that is adjacent to the first thin film transistor element. The partition walls 9016 define a plurality of apertures, namely apertures 9016a through 9016c. The aperture 9016a has a bottom portion where a connection wire 9015 that is connected with a drain electrode remains exposed. Further, an organic semiconductor layer is not formed with respect to the aperture 9016a. The connection wire 9015 is an electrode to be connected to an electrode of a light-emitting element portion to be formed above the organic TFT device. On the other hand, the organic semiconductor layers 9017a, 9017b are formed with respect to the apertures 9016b, 9016c, respectively. Note that the organic semiconductor layers 9017a, 9017b are partitioned from one another.

As already discussed above, a TFT device such as the organic TFT device illustrated in FIG. 14A is used in a liquid crystal display panel, an organic EL display panel, or the like. Further, such a TFT device controls light emission of a light-emitting element portion according to signals input to the gate electrodes 9012a, 9012b, for instance, in the case illustrated in FIG. 14A.

CITATION LIST

Patent Literature

[Patent Literature 1]
Japanese Patent Application Publication No. 2009-76791

SUMMARY

One problem in a conventional TFT device such as the one described above is the formation of an organic semiconductor layer with respect to an area of the TFT device where the formation of an organic semiconductor layer is undesirable (e.g., an inside of the aperture 9016a in the case illustrated in FIG. 14A). The formation of an organic semiconductor layer at such an area of the TFT device results in poor electrical connection between the TFT device and other elements (for instance, the above-described light-emitting element portion), and hence, is problematic. In specific, as illustrated in FIG. 14B, when respectively applying (dropping) organic semiconductor ink 90170, 90171 with respect to the apertures 9016b, 9016c defined by the partition walls 9016, there are cases where the organic semiconductor ink 90170, 90171 overflows, flows out from the apertures 9016b, 9016c, and flows into the aperture 9016a (as indicated by arrow $F_{91}$ in FIG. 14B). This results in the connection wire 9015, which is provided for electrical connection, being covered by an organic semiconductor layer.

It can be assumed that the above-described problem is likely to occur especially in a liquid crystal display panel, an organic EL display panel, etc. This is since there is a demand for realizing a liquid crystal display panel, an organic EL display panel, etc., with higher definition, which gives rise to a demand for downsizing subpixels therein. When the downsizing of subpixels is performed in response to such a demand, the distances between the above-described apertures are shortened, and the risk increases of ink overflowing from a given aperture and flowing into another aperture. As such, the above-described problem is likely to take place.

In addition, as illustrated in FIG. 14B, the application of the organic semiconductor ink 90170, 90171 with respect to the inside of the apertures 9016b, 9016c is performed such that the organic semiconductor ink 90170, 90171 after application bulge upwards such that a top surface of the organic semiconductor ink 90170, 90171 after application is higher in level than top surfaces of the partition walls 9016. Due to this, there may be cases where the organic semiconductor ink 90170 and the organic semiconductor ink 90171 meet and blend with each other. This results in the organic semiconductor layers 9017a, 9017b being provided with undesirable layer-thicknesses. Further, when it is desired to form each of the organic semiconductor layers 9017a, 9017b as an organic semiconductor layer containing different components from the other, the above-described meeting and blending of organic semiconductor ink results in degradation of transistor performance.

It can be assumed that the above-described problem is likely to occur especially in a liquid crystal display panel, an organic EL display panel, etc. This is since, as already described above, there is a demand for realizing a liquid crystal display panel, an organic EL display panel, etc., with higher definition, which gives rise to a demand for downsizing subpixels therein. When the downsizing of subpixels is performed in response to such a demand, the distance between the aperture 9016b and the aperture 9016c is shortened, and the risk increases of the organic semiconductor ink 90170 and the organic semiconductor ink 90171 meeting and blending with each other. As such, the above-described problem is likely to take place.

Note that the same problems as described above can be expected to occur when an inorganic semiconductor layer is to be formed according to the application method.

Non-limiting and exemplary embodiments provide a thin film transistor device having high quality and a manufacturing method thereof, an organic EL display element, and an organic EL display device. Such a high-quality thin film transistor device is realized by, upon formation of a semiconductor layer of the thin film transistor device, preventing formation of a semiconductor layer at an area where the formation of an organic semiconductor layer is undesirable and preventing the meeting and blending of ink applied with respect to adjacent apertures.

In one general aspect, the techniques disclosed here feature a thin film transistor device having the following structure.

The thin film transistor device comprises a first thin film transistor element and a second thin film transistor element that are arranged so as to be adjacent to each other with a gap therebetween. Each of the first thin film transistor element and the second thin film transistor element comprises a gate electrode; a source electrode and a drain electrode; an insulating layer; and a semiconductor layer.

The source electrode and the drain electrode are disposed on the insulating layer with a gap therebetween.

The insulating layer is disposed on the gate electrode.

The semiconductor layer is disposed on the source electrode and the drain electrode so as to cover the source electrode and the drain electrode and fill the gap between the source electrode and the drain electrode, and is in contact with the source electrode and the drain electrode.

The thin film transistor device further comprises partition walls disposed on the insulating layer and partitioning the semiconductor layer of the first thin film transistor element from the semiconductor layer of the second thin film transistor element, the partition walls having liquid-repellant surfaces and defining a first aperture, a second aperture, and a third aperture.

In the thin film transistor device, the first aperture surrounds at least a part of each of the source electrode and the drain electrode of the first thin film transistor element, and the second aperture is adjacent to the first aperture and surrounds at least a part of each of the source electrode and the drain electrode of the second thin film transistor element.

In the thin film transistor device, the third aperture is adjacent to the first aperture with a gap therebetween and is located in a direction, from the first aperture, differing from a direction of the second aperture, and an area of the thin film transistor device surrounded by the third aperture does not include a semiconductor layer and does not function as a channel portion of the thin film transistor device.

In the thin film transistor device, a bottom portion of each of the first and second apertures includes a source electrode portion being a bottom portion of the source electrode and a drain electrode portion being a bottom portion of the drain electrode, in plan view, at the bottom portion of the first aperture, a center of a total of areas of the source electrode portion and the drain electrode portion is offset from a center of area of the bottom portion in a direction differing from a direction of the third aperture, and in plan view, at the bottom portion of one of the first and second apertures, a center a total of areas of the source electrode portion and the drain electrode portion is offset from a center of area of the bottom portion in a direction differing from a direction of the other one of the first and second apertures.

In the thin film transistor device, at the bottom portion of the first aperture, the center of the total of areas of the source electrode portion and the drain electrode portion is offset from the center of area of the bottom portion in a direction differing from the direction of the third aperture. Due to this, when semiconductor ink for forming the semiconductor layer is applied with respect to the first aperture during the manufacture of the thin film transistor device, a surface of the semiconductor ink applied with respect to the first aperture exhibits a shape such that the height of the surface of the applied semiconductor ink at a side of the first aperture in a direction differing from the direction of the third aperture is greater than the height of the surface of the applied semiconductor ink at a side of the first aperture in the direction of the third aperture. In other words, when the semiconductor ink is applied (i.e., when drops of the semiconductor ink are dropped) with respect to the first aperture, the surface of the applied semiconductor ink at a side of the first aperture in the direction of the third aperture can be configured to be lower in height compared to the surface of the applied semiconductor ink at a side of the first aperture at which the source electrode portion and the drain electrode portion, which are offset with respect to the center of area of the first aperture, are disposed.

As such, according to the above-described structure of the thin film transistor device pertaining to one aspect of the present invention, in the manufacture of the thin film transistor device, semiconductor ink is prevented from overflowing and flowing out towards the third aperture, and thus, formation of a semiconductor layer at an area of the thin film transistor device that does not function as a channel portion is prevented. Further, by preventing semiconductor ink from overflowing and flowing out as described above, a layer thickness of the semiconductor later formed within the first aperture can be controlled with high accuracy.

In addition, according to the above-described structure of the thin film transistor device, in plan view of the bottom portions of the first and second apertures, at the bottom portion of one of the first and second apertures, the center of the total of areas of the source electrode portion and the drain electrode portion is offset from the center of area of the bottom portion in a direction differing from the direction of the other one of the first and second apertures. Due to this, when semiconductor ink for forming the semiconductor layer is applied (i.e., when drops of the semiconductor ink are dropped) with respect to the first and second apertures during the manufacture of the thin film transistor device, the surface of the semiconductor ink applied with respect to the one of the first and second apertures exhibits a shape such that the height of the surface of the applied semiconductor ink at a side of the one of the first and second apertures in a direction differing from the direction of the other one of the first and second apertures is greater than the height of the surface of the applied semiconductor ink at a side of the one of the first and second apertures in the direction of the other one of the first and second apertures.

As such, according to the method of manufacturing a thin film transistor device pertaining to one aspect of the present invention, in the manufacture of the thin film transistor device, semiconductor ink applied with respect to one of the first and second apertures is prevented from undesirably meeting and blending with semiconductor ink applied with respect to the other one of the first and second apertures. Therefore, the first and the second thin film transistor elements can be formed with high accuracy, particularly in terms of the material composing the respective semiconductor layers and the layer thickness of the respective semiconductor layers.

As such, the thin film transistor device has a high quality that is realized by, upon formation of the semiconductor layer of the thin film transistor device, preventing formation of a semiconductor layer at an area where the formation of an organic semiconductor layer is undesirable and preventing the meeting and blending of ink applied with respect to adjacent apertures.

These general and specific aspects may be implemented by using an organic EL display element, an organic EL display device, and a method of manufacturing a thin film transistor device.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF THE DRAWINGS

FIG. 3A is a schematic plan view illustrating a partial structure of a TFT substrate 101, and FIG. 3B is a schematic cross-sectional view illustrating a partial structure of the TFT substrate 101.

FIG. 4A is a process flow diagram providing an overview of a method of manufacturing the organic EL display panel 10, and FIG. 4B is a process flow diagram providing an overview of a method of forming the TFT substrate 101.

FIGS. 5A through 5C are schematic process diagrams illustrating some procedures among procedures involved in the manufacturing of the TFT substrate 101.

FIGS. 6A through 6C are schematic process diagrams illustrating some procedures among procedures involved in the manufacturing of the TFT substrate 101.

FIG. 11A is a schematic plan view illustrating, in a structure of an organic EL display panel pertaining to embodiment 11, a partial structure of a TFT substrate, FIG. 11B is a schematic plan view illustrating, in a structure of an organic EL display panel pertaining to embodiment 12, a partial structure of a TFT substrate, and FIG. 11C is a schematic plan view illustrating, in a structure of an organic EL display panel pertaining to embodiment 13, a partial structure of a TFT substrate.

FIG. 14A is a cross-sectional view illustrating, in a structure of an organic EL display device pertaining to conventional technology, a partial structure of a TFT substrate, and FIG. 14B is a cross-sectional view illustrating a procedure pertaining to application of organic semiconductor ink among procedures involved in the manufacturing of the TFT substrate pertaining to conventional technology.

DETAILED DESCRIPTION

Overview of Aspects of Present Invention

Figure 1:
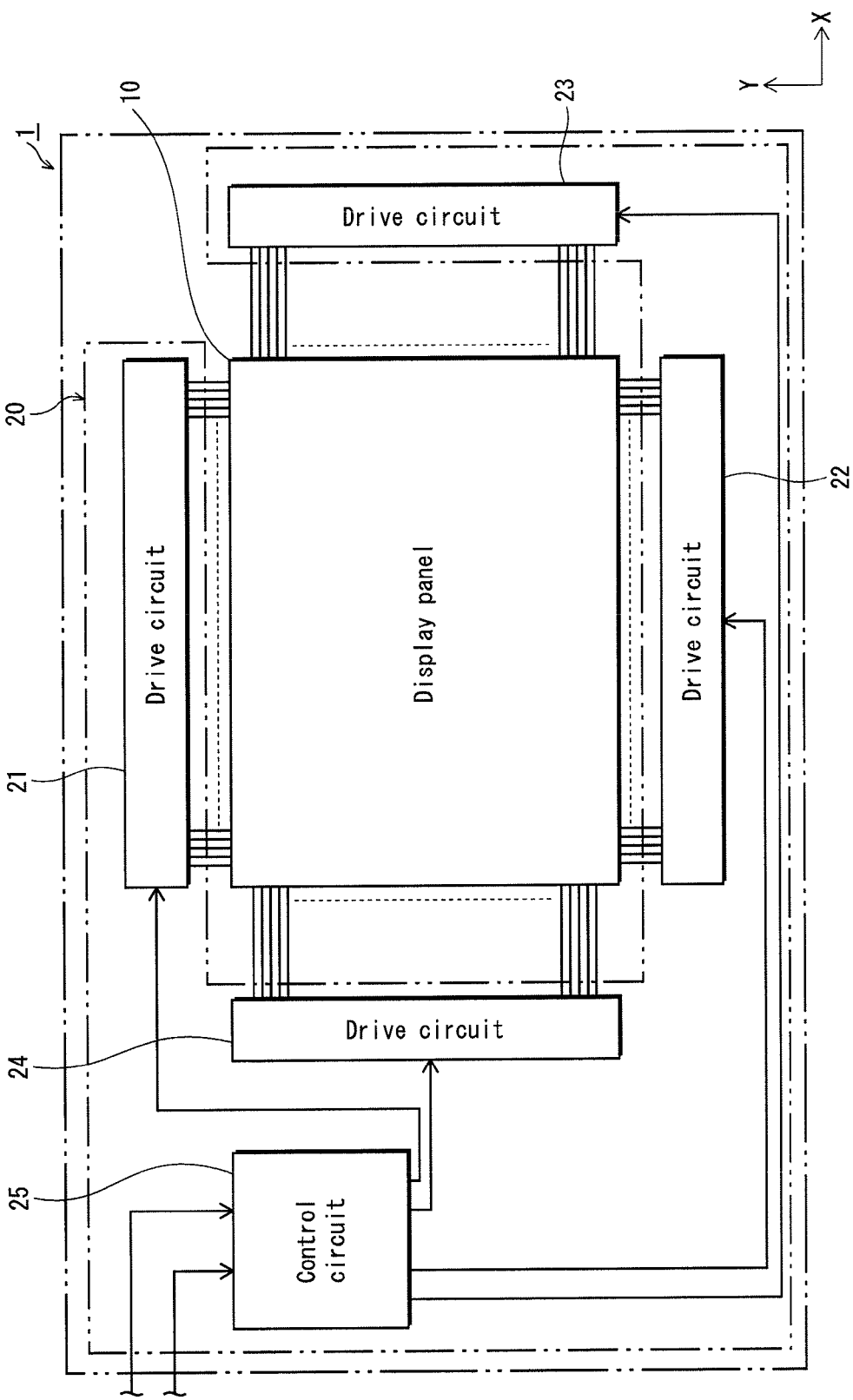
FIG. 1 is a schematic block diagram illustrating an overall structure of an organic EL display device 1 pertaining to embodiment 1.

One aspect of the present invention is a thin film transistor device comprising a first thin film transistor element and a second thin film transistor element that are arranged so as to be adjacent to each other with a gap therebetween. Each of the first thin film transistor element and the second thin film transistor element comprises a gate electrode; a source electrode and a drain electrode; an insulating layer; and a semiconductor layer.

The source electrode and the drain electrode are disposed on the insulating layer with a gap therebetween.

The insulating layer is disposed on the gate electrode.

The semiconductor layer is disposed on the source electrode and the drain electrode so as to cover the source electrode and the drain electrode and fill the gap between the source electrode and the drain electrode, and is in contact with the source electrode and the drain electrode.

The thin film transistor device pertaining to one aspect of the present invention further comprises partition walls disposed on the insulating layer and partitioning the semiconductor layer of the first thin film transistor element from the semiconductor layer of the second thin film transistor element, the partition walls having liquid-repellant surfaces and defining a first aperture, a second aperture, and a third aperture.

In the thin film transistor device pertaining to one aspect of the present invention, the first aperture surrounds at least a part of each of the source electrode and the drain electrode of the first thin film transistor element, and the second aperture is adjacent to the first aperture and surrounds at least a part of each of the source electrode and the drain electrode of the second thin film transistor element.

In the thin film transistor device pertaining to one aspect of the present invention, the third aperture is adjacent to the first aperture with a gap therebetween and is located in a direction, from the first aperture, differing from a direction of the second aperture, and an area of the thin film transistor device surrounded by the third aperture does not include a semiconductor layer and does not function as a channel portion of the thin film transistor device.

In the thin film transistor device pertaining to one aspect of the present invention, a bottom portion of each of the first and second apertures includes a source electrode portion being a bottom portion of the source electrode and a drain electrode portion being a bottom portion of the drain electrode, in plan view, at the bottom portion of the first aperture, a center of a total of areas of the source electrode portion and the drain electrode portion is offset from a center of area of the bottom portion in a direction differing from a direction of the third aperture, and in plan view, at the bottom portion of one of the first and second apertures, a center a total of areas of the source electrode portion and the drain electrode portion is offset from a center of area of the bottom portion in a direction differing from a direction of the other one of the first and second apertures.

In other words, at the bottom portion of the first aperture, the source electrode portion and the drain electrode portion, which commonly have high wettability, are offset from the center of area of the bottom portion in a direction differing from the direction of the third aperture, and at the bottom portion of one of the first and second apertures, the source electrode portion and the drain electrode portion are offset from the center of area of the bottom portion in a direction differing from a direction of the other one of the first and second apertures.

Note that, when denoting: the area of the source electrode portion as $A_S$; a distance from a given point to the center of area of the source electrode portion as x; the area of the drain electrode portion as $A_D$; a distance from the given point to the center of area of the drain electrode portion as y, "a center of a total of areas of the source electrode portion and the drain electrode portion", denoted as z, can be expressed as shown in Math. 1.

$$z=(A_S \times x + A_D \times y)/(A_S + A_D) \quad \text{[Math. 1]}$$

Math. 1 is a mathematical expression defining a relationship in a direction in which a line connecting the center of area of the bottom portion of the first aperture and the center of area of the bottom portion of the third aperture extends.

In the thin film transistor device pertaining to one aspect of the present invention, at the bottom portion of the first aperture, the center of the total of areas of the source electrode portion and the drain electrode portion is offset from the center of area of the bottom portion in a direction differing from the direction of the third aperture. Due to this, when semiconductor ink for forming the semiconductor layer is applied with respect to the first aperture during the manufacture of the thin film transistor device, a surface of the semiconductor ink applied with respect to the first aperture exhibits a shape such that the height of the surface of the applied semiconductor ink at a side of the first aperture in a direction differing from the direction of the third aperture is greater than the height of the surface of the applied semiconductor ink at a side of the first aperture in the direction of the third aperture. In other words, when the semiconductor ink is applied (i.e., when drops of the semiconductor ink are dropped) with respect to the first aperture, the surface of the applied semiconductor ink at a side of the first aperture in the direction of the third aperture can be configured to be lower in height compared to the surface of the applied semiconductor ink at a side of the first aperture at which the source electrode portion and the drain electrode portion, which are offset with respect to the center of area of the first aperture, are disposed.

As such, according to the above-described structure of the thin film transistor device pertaining to one aspect of the present invention, in the manufacture of the thin film transistor device, semiconductor ink is prevented from overflowing and flowing out towards the third aperture, and thus, formation of a semiconductor layer at an area of the thin film transistor device that does not function as a channel portion is prevented. Further, by preventing semiconductor ink from overflowing and flowing out as described above, a layer thickness of the semiconductor layer formed within the first aperture can be controlled with high accuracy.

In addition, according to the above-described structure of the thin film transistor device pertaining to one aspect of the present invention, in plan view of the bottom portions of the first and second apertures, at the bottom portion of one of the first and second apertures, the center of the total of areas of the source electrode portion and the drain electrode portion is offset from the center of area of the bottom portion in a direction differing from the direction of the other one of the first and second apertures. Due to this, when semiconductor ink for forming the semiconductor layer is applied (i.e., when drops of the semiconductor ink are dropped) with respect to the first and second apertures during the manufacture of the thin film transistor device, the surface of the semiconductor ink applied with respect to the one of the first and second apertures exhibits a shape such that the height of the surface of the applied semiconductor ink at a side of the one of the first and second apertures in a direction differing from the direction of the other one of the first and second apertures is greater than the height of the surface of the applied semiconductor ink at a side of the one of the first and second apertures in the direction of the other one of the first and second apertures.

As such, according to the thin film transistor device pertaining to one aspect of the present invention, in the manufacture of the thin film transistor device, semiconductor ink applied with respect to one of the first and second apertures is prevented from undesirably meeting and blending with semiconductor ink applied with respect to the other one of the first and second apertures. Therefore, the first and the second thin film transistor elements can be formed with high accuracy, particularly in terms of the material composing the respective semiconductor layers and the layer thickness of the respective semiconductor layers.

As such, the thin film transistor device pertaining to one aspect of the present invention has a high quality that is realized by, upon formation of the semiconductor layer of the thin film transistor device, preventing formation of a semiconductor layer at an area where the formation of an organic semiconductor layer is undesirable and preventing the meeting and blending of ink applied with respect to adjacent apertures.

In the thin film transistor device pertaining to one aspect of the present invention, the bottom portion of the first aperture may include a first portion where the source electrode portion and the drain electrode portion do not exist and thus, where the insulating layer of the first thin film transistor element is in direct contact with the semiconductor layer of the first thin film transistor element, the first portion being within an area of the bottom portion located in the direction of the third aperture. According to this, when semiconductor ink for forming the semiconductor layer is applied (i.e., when drops of the semiconductor ink are dropped) with respect to the first aperture during the manufacture of the thin film transistor device, a surface of the semiconductor ink applied with respect to the first aperture exhibits a shape such that the height of the surface of the applied semiconductor ink at a side of the first aperture in a direction differing from the direction of the third aperture is greater than the height of the surface of the applied semiconductor ink at a side of the first aperture in the direction of the third aperture with higher certainty. As such, semiconductor ink is prevented from overflowing and flowing into the third aperture with certainty, and hence, a thin film semiconductor device having high quality is realized.

In the thin film transistor device pertaining to one aspect of the present invention, the bottom portion of the first aperture may further include a second portion where the source electrode portion and the drain electrode portion do not exist and thus, where the insulating layer of the first thin film transistor element is in direct contact with the semiconductor layer of the first thin film transistor element, the second portion being within an area of the bottom portion located in a direction differing from the direction of the third aperture, and in plan view of the bottom portion of the first aperture, an area of the first portion may be greater than an area of the second portion. When additionally disposing the portion where the insulating layer is in direct contact with the semiconductor layer at the side of the first aperture in the direction of the second aperture and defining the area of the portion where the insulating layer is in direct contact with the semiconductor layer as described above, when semiconductor ink is applied with respect to the first aperture in the manufacture of the thin film transistor device, the surface of the applied semiconductor ink is relatively low at the sides of the first aperture in the direction of the third and second apertures. As such, the overflowing and flowing out of ink towards the third and second apertures can be prevented with certainty.

In the thin film transistor device pertaining to one aspect of the present invention, in plan view, at the bottom portion of the other one of the first and second apertures, a center of a total of areas of the source electrode portion and the drain electrode portion may be offset from a center of area of the bottom portion in a direction differing from a direction of the one of the first and second apertures. According to this structure, when semiconductor ink is applied with respect to both the first and second apertures during the manufacture of the thin film transistor device, the meeting and blending of semiconductor ink applied with respect to the first aperture and semiconductor ink applied with respect to the second aperture is prevented with higher certainty.

In the thin film transistor device pertaining to one aspect of the present invention, in plan view of the first, second, and third apertures, the third aperture, the first aperture, and the second aperture may be arranged in series in the stated order along a predetermined direction, at the bottom portion of the first aperture, the center of a total of areas of the source electrode portion and the drain electrode portion may be offset from the center of area of the bottom portion in a first direction that intersects the predetermined direction, and at the bottom portion of the second aperture a center of a total of areas of the source electrode portion and the drain electrode portion may be offset from the center of area of the bottom portion in a second direction that intersects the predetermined direction. By disposing, in each of the first and second apertures, the source electrode portion and drain electrode portion as described above, when the application of semiconductor ink with respect to both the first aperture and the second aperture is performed in the manufacture of the thin film transistor device, both the overflowing and flowing out of semiconductor ink towards the third aperture and the meeting and blending of semiconductor ink applied with respect to the first aperture and semiconductor ink applied with respect to the second aperture are prevented.

In the thin film transistor device pertaining to one aspect of the present invention, the first direction and the second direction may be opposite directions. According to this structure, the undesirable meeting and blending of semiconductor ink applied with respect to the first aperture and semiconductor ink applied with respect to the second aperture can be prevented with higher certainty.

In the thin film transistor device pertaining to one aspect of the present invention, in plan view of the bottom portion of the first aperture, a center of area of one of the source electrode portion and the drain electrode portion may be offset from the center of area of the bottom portion in a direction differing from the direction of the third aperture, and a center of area of the other one of the source electrode portion and the drain electrode portion may coincide with the center of area of the bottom portion. According to this structure, in the thin film transistor device pertaining to one aspect of the present invention, at the bottom portion of the first aperture, it is not necessary that both the source electrode portion and the drain electrode portion are disposed so as to be offset with respect to the center of area of the bottom portion of the first aperture. That is, the same effects as described above can be achieved by disposing one of the source electrode portion and the drain electrode portion so as to be offset with respect to the center of area of the bottom portion of the first aperture. This results in flexibility of the layout of the thin film transistor device being enhanced.

In the thin film transistor device pertaining to one aspect of the present invention, in plan view of the bottom portion of the first aperture, a center of area of each of the source electrode portion and the drain electrode portion may be offset from the center of area of the bottom portion in a direction differing from the direction of the third aperture. According to this structure, in the thin film transistor device pertaining to one aspect of the present invention, at the bottom portion of the first aperture, both the source electrode portion and the drain electrode portion are disposed so as to be offset with respect to the center of area of the bottom portion of the first aperture. As such, compared to when disposing only one of the source electrode portion and the drain electrode portion so as to be offset with respect to the center of area of the bottom portion of the first aperture, the above-described effects can be achieved with higher certainty.

In the thin film transistor device pertaining to one aspect of the present invention, at the bottom portion of the first aperture, at least one of the source electrode portion and the drain electrode portion may be located apart from a side surface portion, of the partition walls, facing the first aperture at a side thereof located in the direction of the third aperture, and may be in contact with the side surface portion facing the first aperture at a side thereof located in a direction differing from the direction of the third aperture, and at the bottom portion of the one of the first and second aperture's, at least one of the source electrode portion and the drain electrode portion may be located apart from a side surface portion, of the partition walls, facing the one of the first and second apertures at a side thereof located in the direction of the other one of the first and second aperture and may be in contact with the side surface portion facing the other one of the first and second apertures at a side thereof in a direction differing from the direction of the other one of the first and second apertures.

The same effects as described above can be achieved by disposing, in each of the first and second apertures, the source electrode portion and the drain electrode portion as described above.

In the thin film transistor device pertaining to one aspect of the present invention, a liquid repellency of the surfaces of the partition walls may be greater than a liquid repellency of a surface of the insulating layer, in each of the first and second thin film transistor elements, that is in contact with the semiconductor layer, and the liquid repellency of the surface of the insulating layer, in each of the first and second thin film transistor elements, that is in contact with the semiconductor layer may be greater than a liquid repellency of a surface of each of the source electrode and the drain electrode in each of the first and second thin film transistor elements. When the above-described relation is satisfied, the surface of the semiconductor ink applied with respect to the first aperture and the surface of the semiconductor ink applied with respect to the second aperture fulfill the above-described relationship in terms of shape when the application of semiconductor ink is performed in the manufacture of the thin film transistor device, and hence, the above-described effects can be achieved with certainty.

In the thin film transistor device pertaining to one aspect of the present invention, a bottom portion of the third aperture may include a wire for electrically connecting with one of the source electrode and the drain electrode in the first thin film transistor element or one of the source electrode and the drain electrode in the second thin film transistor element. When the third aperture is used as a contact area in the thin film transistor device for outputting signals from the thin film transistor elements to the outside, the formation of a semiconductor layer with respect to the connection wire is to be prevented. Here, by employing the above-described structure, the flowing out of semiconductor ink towards the third aperture upon application of semiconductor ink is prevented with certainty, and thus, it is ensured that the third aperture maintains the function as the contact area.

One aspect of the present invention is an organic EL display element comprising: any of the thin film transistor devices described above; a planarizing film formed above the thin film transistor device and having a contact hole formed therein; a lower electrode formed on the planarizing film so as to cover the planarizing film and a side surface of the planarizing film defining the contact hole, and electrically connected with one of the source electrode and the drain electrode in the first thin film transistor element or one of the source electrode and the drain electrode in the second thin film transistor element; an upper electrode formed above the lower electrode; and an organic light-emitting layer interposed between the lower electrode and the upper electrode, wherein the contact hole is in communication with the third aperture of the thin film transistor device.

According to this, since the organic EL display element pertaining to one aspect of the present invention includes any of the thin film transistor devices described above, the organic EL element is ensured to have high quality, and at the same time, to have high yield in the manufacture thereof.

One aspect of the present invention is an organic EL display device comprising the organic EL display element pertaining to one aspect of the present invention. According to this, the organic EL display device is also ensured to have high quality, and at the same time, to have high yield in the manufacture thereof.

One aspect of the present invention is a method of manufacturing a thin film transistor device comprising:

forming a first gate electrode and a second gate electrode on a substrate so as to be adjacent to each other with a gap therebetween;

forming an insulating layer so as to cover the first gate electrode and the second gate electrode;

forming first and second source electrodes and first and second drain electrodes on the insulating layer, wherein (i) the first source electrode and the first drain electrode are formed with respect to the first gate electrode with a gap therebetween, and (ii) the second source electrode and the second drain electrode are formed with respect to the second gate electrode with a gap therebetween;

depositing a layer of photosensitive resist material such that, above the insulating layer, the layer of photosensitive resist material covers the first and second source electrodes and the first and second drain electrodes as well as areas therearound;

forming partition walls on the insulating layer by performing mask exposure and patterning of the layer of photosensitive resist material, the partition walls having liquid-repellant surfaces and defining a first aperture, a second aperture that is adjacent to the first aperture, and a third aperture, the first aperture surrounding at least a part of each of the first source electrode and the first drain electrode, the second aperture surrounding at least a part of each of the second source electrode and the second drain electrode; and a first semiconductor layer with respect to the first aperture and a second semiconductor layer with respect to the second aperture by applying semiconductor material with respect to the corresponding aperture and drying the semiconductor material so applied, wherein (i) the first semiconductor layer is formed so as to be in contact with the first source electrode and the first drain electrode, and (ii) the second semiconductor layer is formed so as to be in contact with the second source electrode and the second drain electrode.

In the method of manufacturing a thin film transistor device pertaining to one aspect of the present invention, the partition walls are formed such that the third aperture is adjacent to the first aperture with a gap therebetween and is located in a direction, from the first aperture, differing from a direction of the second aperture, an area of the thin film transistor device surrounded by the third aperture does not include a semiconductor layer and does not function as a channel portion of the thin film transistor device, a bottom portion of each of the first and second apertures includes a source electrode portion being a bottom portion of the corresponding source electrode and a drain electrode portion being a bottom portion of the corresponding drain electrode, in plan view, at the bottom portion of the first aperture, a center of a total of areas of the source electrode portion and the drain electrode portion is offset from a center of area of the bottom portion in a direction differing from a direction of the third aperture, and in plan view, at the bottom portion of one of the first and second apertures, a center a total of areas of the source electrode portion and the drain electrode portion is offset from a center of area of the bottom portion in a direction differing from a direction of the other one of the first and second apertures.

In the method of manufacturing a thin film transistor device pertaining to one aspect of the present invention, the forming of the partition walls is performed such that, at the bottom portion of the first aperture, the source electrode portion and the drain electrode portion are disposed as described above. Due to this, when semiconductor ink for forming the first semiconductor layer is applied with respect to the first aperture, a surface of the semiconductor ink applied with respect to the first aperture exhibits a shape such that the height of the surface of the applied semiconductor ink at a side of the first aperture in a direction differing from the direction of the third aperture is greater than the height of the surface of the applied semiconductor ink at a side of the first aperture in the direction of the third aperture. In other words, when the semiconductor ink is applied (i.e., when drops of the semiconductor ink are dropped) with respect to the first aperture, the surface of the applied semiconductor ink at a side of the first aperture in the direction of the third aperture can be configured to be lower in height compared to the surface of the applied semiconductor ink at a side of the first aperture at which the source electrode portion and the drain electrode portion, which are offset with respect to the center of area of the first aperture, are disposed.

As such, according to the method of manufacturing a thin film transistor device pertaining to one aspect of the present invention, semiconductor ink is prevented from overflowing and flowing out towards the third aperture, and thus, formation of a semiconductor layer at an area of the thin film transistor device that does not function as a channel portion is prevented. Further, by preventing semiconductor ink from overflowing and flowing out as described above, a layer thickness of the semiconductor layer formed within the first aperture can be controlled with high accuracy.

In the method of manufacturing a thin film transistor device pertaining to one aspect of the present invention, the partition walls are formed such that at the bottom portion of one of the first and second apertures, the center a total of areas of the source electrode portion and the drain electrode portion is offset from the center of area of the bottom portion in a direction differing from the direction of the other one of the first and second apertures. Due to this, when semiconductor ink for forming the semiconductor layer is applied (i.e., when drops of the semiconductor ink are dropped) with respect to the first and second apertures during the manufacture of the thin film transistor device, the surface of the semiconductor ink applied with respect to the one of the first and second apertures exhibits a shape such that the height of the surface of the applied semiconductor ink at a side of the one of the first and second apertures in a direction differing from the direction of the other one of the first and second apertures is greater than the height of the surface of the applied semiconductor ink at a side of the one of the first and second apertures in the direction of the other one of the first and second apertures.

As such, according to the thin film transistor device pertaining to one aspect of the present invention, in the manufacture of the thin film transistor device, semiconductor ink applied with respect to one of the first and second apertures is prevented from undesirably meeting and blending with semiconductor ink applied with respect to the other one of the first and second apertures. Therefore, the first and the second thin film transistor elements can be formed with high accuracy, particularly in terms of the material composing the respective semiconductor layers and the layer thickness of the respective semiconductor layers.

As such, according to the method of manufacturing a thin film transistor device pertaining to one aspect of the present invention, a thin film transistor device having high quality can be manufactured by, upon formation of the semiconductor layer of the thin film transistor device, preventing formation of a semiconductor layer at an area where the formation of an organic semiconductor layer is undesirable and preventing the meeting and blending of ink applied with respect to adjacent apertures.

In the method of manufacturing a thin film transistor device pertaining to one aspect of the present invention, the partition walls may be formed such that the bottom portion of the first aperture includes a first portion where the source electrode portion and the drain electrode portion do not exist and thus, where the insulating layer is to come in direct contact with the first semiconductor layer, the first portion being within an area of the bottom portion located in the direction of the third aperture. According to this method, the semiconductor ink applied (dropped) with respect to each of the first and second apertures can be controlled such that the surface of the semiconductor ink exhibits the above-described state. As such, a thin film transistor device having high quality can be manufactured.

In the method of manufacturing a thin film transistor device pertaining to one aspect of the present invention, the partition walls may be formed such that the bottom portion of the first aperture further includes a second portion where the source electrode portion and the drain electrode portion do not exist and thus, where the insulating layer is to come in direct contact with the first semiconductor layer, the second portion being within an area of the bottom portion located in a direction differing from the direction of the third aperture, and in plan view of the bottom portion of the first aperture, an area of the first portion may be greater than an area of the second portion. According to this method, the semiconductor ink applied (dropped) with respect to each of the first and second apertures can be controlled such that the surface of the semiconductor ink exhibits the above-described state with higher certainty. As such, a thin film transistor device having high quality can be manufactured.

In the method of manufacturing a thin film transistor device pertaining to one aspect of the present invention, the forming of the insulating layer, the forming of the first and second source electrodes and the first and second drain electrodes, the forming of the partition walls, and the forming of the first and second semiconductor layers may be performed such that a liquid repellency of the surfaces of the partition walls is greater than a liquid repellency of a surface of the insulating layer that is to come in contact with the first and second semiconductor layers, and the liquid repellency of the surface of the insulating layer that is to come in contact with the first and second semiconductor layers is greater than a liquid repellency of a surface of each of the first and second source electrodes and each of the first and second drain electrodes. When the above-described relationship is satisfied, the surface of the semiconductor ink applied with respect to the first aperture and the surface of the semiconductor ink applied with respect to the second aperture exhibit the respective shapes as described above when the application of semiconductor ink is performed in the forming of the first and second semiconductor layers, and hence, the above-described effects can be achieved with certainty.

Note that in the above, when a given element is "on" or "above" another element, the given element is not limited to being disposed in the absolutely vertical direction with respect to the other element. Instead, in the present disclosure, the terms "on" and "above" are used to indicate the relative positions of different elements, or more specifically, the relative positions of different elements along the direction in which such elements are layered. Further, in the present disclosure, the term "above" is used to indicate not only a state where a gap exists between two elements, but also a state where the two elements are in close contact with each other, and similarly, the term "on" is used to indicate not only a state where two elements are in close contact with each other, but also a state where a gap exists between the two elements.

In the following, explanation is provided of characteristics of various forms of implementation and the effects achieved thereby, with reference to several specific examples thereof. Further, note that although the following embodiments include description on fundamental characteristic features, the present disclosure is not to be construed as being limited to the description provided in the following embodiments other than such fundamental features.

Embodiment 1

1. Overall Structure of Organic EL Display Device 1

In the following, description is provided on a structure of an organic EL display device 1 pertaining to embodiment 1 of the present disclosure, with reference to FIG. 1.

As illustrated in FIG. 1, the organic EL display device 1 includes an organic EL display panel 10 and a drive control circuit portion 20 connected to the organic EL display panel 10.

The organic EL display panel 10 is a panel that makes use of electroluminescence of organic material. The organic EL display panel 10 is composed of a plurality of organic EL elements that are, for instance, arranged so as to form a matrix. The drive control circuit portion 20 includes four drive circuits, namely drive circuits 21 through 24, and a control circuit 25.

Note that, in the organic EL display device 1 pertaining to the present embodiment, the positional arrangement of the drive control circuit portion 20 with respect to the organic EL display panel 10 is not limited to that illustrated in FIG. 1.

2. Structure of Organic EL Display Panel 10

In the following, description is provided on a structure of the organic EL display panel 10, with reference to the schematic cross-sectional view of FIG. 2, and FIGS. 3A and 3B.

Figure 2:
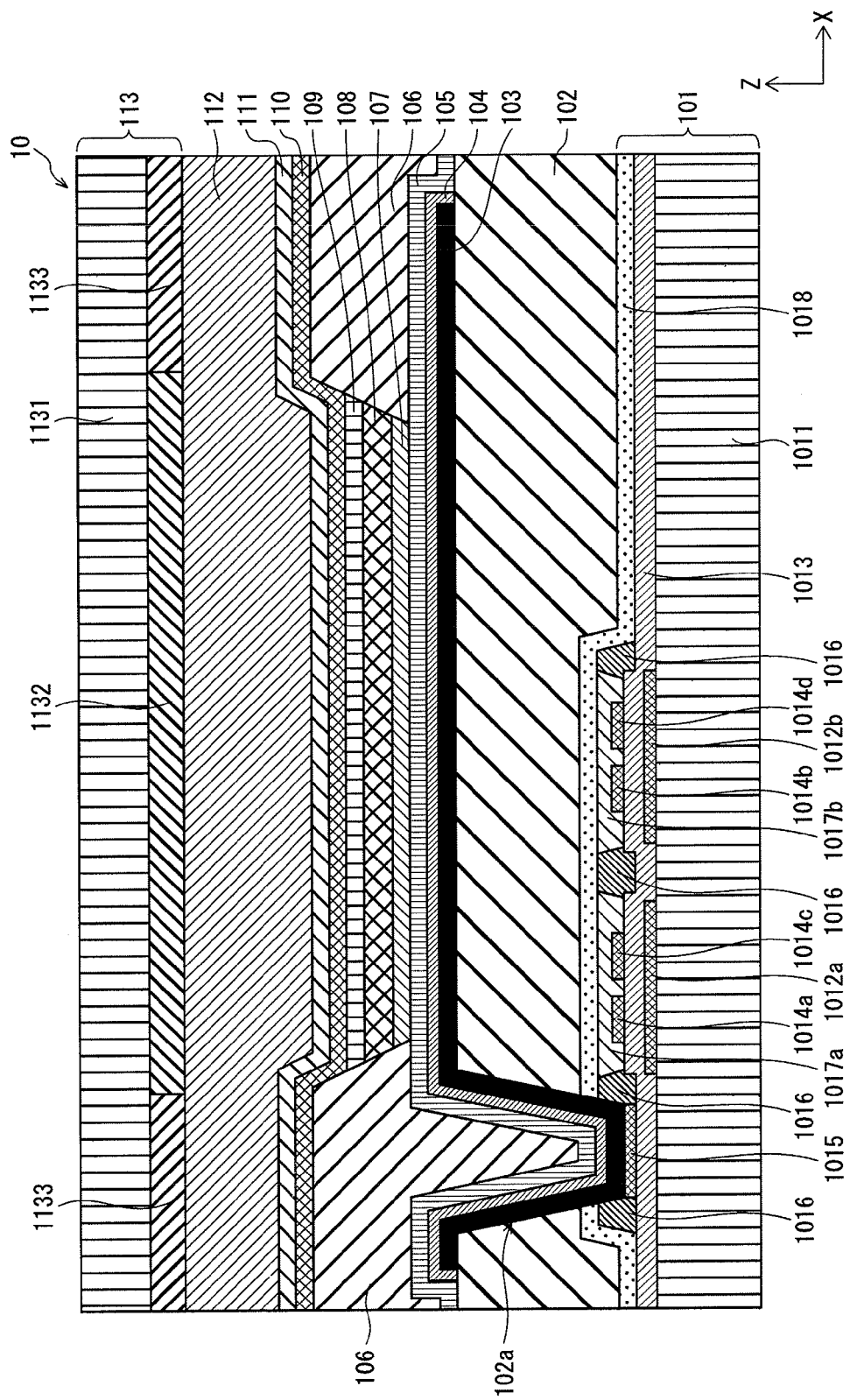
FIG. 2 is a schematic cross-sectional view illustrating a partial structure of an organic EL display panel 10.

As illustrated in FIG. 2, the organic EL display panel 10 includes a thin film transistor (TFT) substrate 101. The TFT substrate 101 has a structure where gate electrodes 1012a, 1012b are layered on a substrate 1011 with a gap between one another, and an insulating layer 1013 is layered so as to cover the substrate 1011 and the gate electrodes 1012a, 1012b. On the insulating layer 1013, a source electrode 1014a and a drain electrode 1014c corresponding to the gate electrode 1012a are disposed, and similarly, a source electrode 1014b and a drain electrode 1014d corresponding to the gate electrode 1012b are disposed. As illustrated in FIG. 3A, the source electrode 1014a and the drain electrode 1014c are arranged on the insulating layer 1013 so as to be in alignment in the X axis direction in FIG. 3A, and similarly, the source electrode 1014b and the drain electrode 1014d are arranged so as to be in alignment in the X axis direction in FIG. 3A.

In addition, as illustrated in FIG. 2 and FIG. 3A, a connection wire 1015 is disposed on the insulating layer 1013 at the left side of the source electrode 1014a in the X axis direction, and such that there is a gap between the connection wire 1015 and the source electrode 1014a. The connection wire 1015 is formed by extending one of the source electrode 1014a, the drain electrode 1014c, the source electrode 1014b, and the drain electrode 1014d. Alternatively, the connection wire 1015 is electrically connected to one of the source electrode 1014a, the drain electrode 1014c, the source electrode 1014b, and the drain electrode 1014d.

Further, as illustrated in FIGS. 2 and 3A, partition walls 1016 are disposed on the insulating layer 1013. The partition walls 1016 surround (a) the connection wire 1015, (b) a combination of the source electrode 1014a and the drain electrode 1014c, and (c) a combination of the source electrode 1014b and the drain electrode 1014d, in such a manner that (a), (b), and (c) are separated from one another by being surrounded by the partition walls 1016. In other words, as illustrated in FIG. 3A, the partition walls 1016 define three apertures, namely an aperture 1016a, an aperture 1016b, and an aperture 1016c. The aperture 1016a at the far left side in the X axis direction has a bottom portion where the connection wire 1015 remains exposed. The aperture 1016a does not function as a channel portion but functions as a contact portion that contacts an anode. On the other hand, the aperture 1016b has a bottom portion where the source electrode 1014a and the drain electrode 1014c remain exposed, and the aperture 1016c has a bottom portion where the source electrode 1014b and the drain electrode 1014d remain exposed. The apertures 1016b and 1016c function as channel portions.

Further, as illustrated in FIG. 3B, at each of the bottom portions of the apertures 1016b, 1016c, the corresponding one of the source electrodes 1014a, 1014b and the corresponding one of the drain electrodes 1014c, 1014d (refer to FIG. 3A for illustration) are not disposed so as to extend entirely across the bottom portion in the X axis direction. That is, at the bottom portion of the aperture 1016b, a portion of the insulating layer 1013 remains exposed at a left side of the bottom portion in the X axis direction (such portion hereinafter referred to exposed portion 1013a) and a portion of the insulating layer 1013 remains exposed at a right side of the bottom portion in the X axis direction (such portion hereinafter referred to exposed portion 1013b). Similarly, at the bottom portion of the aperture 1016c, a portion of the insulating layer 1013 remains exposed at a left side of the bottom portion in the X axis direction (such portion hereinafter referred to exposed portion 1013c) and a portion of the insulating layer 1013 remains exposed at a right side of the bottom portion in the X axis direction (such portion hereinafter referred to exposed portion 1013d). In addition, at the bottom portion of the aperture 1016b, a portion of the insulating layer 1013 remains exposed at an upper side of the bottom portion in the Y axis direction (such portion hereinafter referred to as an exposed portion 1013e). Similarly, at the bottom portion of the aperture 1016c, a portion of the insulating layer 1013 remains exposed at a lower side of the bottom portion in the Y axis direction (such portion hereinafter referred to as an exposed portion 1013f).

Returning to FIG. 2, within the aperture 1016b defined by the partition walls 1016, an organic semiconductor layer 1017a is disposed on the source electrode 1014a and the drain electrode 1014c included therein. Similarly, within the aperture 1016c defined by the partition walls 1016, an organic semiconductor layer 1017b is disposed on the source electrode 1014b and the drain electrode 1014d. More specifically, the organic semiconductor layer 1017a is formed so as to cover the source electrode 1014a and the drain electrode 1014c and also fill a gap between the source electrode 1014a and the drain electrode 1014c. The organic semiconductor layer 1017a so formed is in contact with the source electrode 1014a and the drain electrode 1014c. The organic semiconductor layer 1017b is formed in a similar manner and is in contact with the source electrode 1014b and the drain electrode 1014d. Further, the organic semiconductor layer 1017a and the organic semiconductor layer 1017b are partitioned from each other by the partition walls 1016.

Here, note that the organic semiconductor layer 1017a is in direct contact with the insulating layer 1013 at the exposed portions 1013a, 1013b, 1013e illustrated in FIG. 3B, without the source electrode 1014a or the drain electrode 1014c existing therebetween. Similarly, the organic semiconductor layer 1017b is in direct contact with the insulating layer 1013 at the exposed portions 1013c, 1013d, 1013f illustrated in FIG. 3B, without the source electrode 1014b or the drain electrode 1014d existing therebetween. Also refer to FIG. 2 for illustration of the above.

Further, as illustrated in FIG. 2, a passivation film 1018 is disposed so as to cover the organic semiconductor layer 1017a, the organic semiconductor layer 1017b, and the insulating layer 1013. However, it should be noted that the passivation film 1018 is not disposed above the area corresponding to the connection wire 1015, and therefore, an opening is formed at such an area.

The TFT substrate 101 of the organic EL display panel 10 pertaining to the present embodiment has a structure as described up to this point.

Next, as illustrated in FIG. 2, a planarizing film 102 covers the TFT substrate 101 from above. However, it should be noted that the planarizing film 102 does not cover the connection wire 1015, and a contact hole 102a is formed in the planarizing film 102 at an area above the connection wire 1015. The contact hole 102a is in communication with the aperture 1016a of the TFT substrate 101.

An anode 103, a light-transmissive conduction film 104, and a hole injection layer 105 are disposed in the stated order on a main surface of the planarizing film 102. Here, each of the anode 103, the light-transmissive conduction film 104, and the hole injection layer 105 is disposed not only on the planarizing film 102 but also along a side surface of the planarizing film 102 defining the contact hole 102a. The anode 103 is in contact with and electrically connected to the connection wire 1015.

Further, banks 106 are disposed on the hole injection layer 105. The banks 106 are disposed so as to surround an area above the hole injection layer 105 that corresponds to a light-emitting portion (i.e., a subpixel). In an opening formed at the above-described area by the banks 106, a hole transport layer 107, an organic light-emitting layer 108, and an electron transport layer 109 are disposed in the stated order.

On the electron transport layer 109 and on exposed surfaces of the banks 106, a cathode 110 and a sealing layer 111 are disposed in the stated order so as to cover the electron transport layer 109 and the exposed surfaces of the banks 106. Further, a color filter (CF) substrate 113 is arranged so as to face the sealing layer 111. The sealing layer 111 and the CF substrate 113 are joined together by an adhesion layer 112 filling a gap therebetween. The CF substrate 113 includes a substrate 1131, and a color filter 1132 and a black matrix 1133 disposed on a main surface of the substrate 1131. The main surface of the substrate 1131 is a surface of the substrate 1131 that is located lower in the Z axis direction.

3. Material Constituting Organic EL Display Panel 10

Each part of the organic EL display panel 10 may, for instance, be formed by using the materials as described in the following.

(i) Substrate 1011

The substrate 1011 may be, for instance: a glass substrate; a quartz substrate; a silicon substrate; a metal substrate composed of, for example, molybdenum sulfide, copper, zinc, aluminum, stainless steel, magnesium, iron, nickel, gold, or silver; a semiconductor substrate composed of, for example, gallium arsenide; or a plastic substrate.

Examples of material constituting the plastic substrate include thermoplastic resins and thermosetting resins. Examples thereof include polyolefins, such as polyethylene, polypropylene, ethylene-propylene copolymers, and ethylene-vinyl acetate copolymers (EVA), cyclic polyolefin, modified polyolefins, polyvinyl chloride, polyvinylidene chloride: polystyrene, polyamide, polyimide (PI), polyamide-imide, polyesters, such as polycarbonate, poly(4-methylpentene-1), ionomers, acrylic-based resins, polymethyl methacrylater acrylic-styrene copolymers (AS resins), butadiene-styrene copolymers, ethylene vinyl alcohol copolymers (EVOH), polyethylene terephthalate (PET), polybutylene terephthalate, polyethylene naphthalate (PEN), and polycyclohexane terephthalate (PCT), polyether, polyether ketone, polyethersulfone (PES), polyether imide, polyacetal, polyphenylene oxide, modified polyphenylene oxide, polyarylate, aromatic polyesters (liquid crystal polymer), polytetrafluoroethylene, polyvinylidene fluoride, other fluorocarbon resins, thermoplastic elastomers, such as styrene-based elastomers, polyolefin-based elastomers, polyvinyl chloride-based elastomers, polyurethane-based elastomers, fluorocarbon rubbers, and chlorinated polyethylene-based elastomers, epoxy resins, phenolic resins, urea resins, melamine resins, unsaturated polyesters, silicone resins, and polyurethane, and copolymers, blends, and polymer alloys thereof. The plastic substrate may be a single layer substrate composed of one of the materials described above or a multilayer substrate having layers composed of two or more materials.

(ii) Gate Electrodes 1012a, 1012b

The gate electrodes 1012a, 1012b may be made of, for instance, any material having electrical conductivity.

Specific examples thereof include metals, such as chromium, aluminum, tantalum, molybdenum, niobium, copper, silver, gold, platinum, palladium, indium, nickel, and neodymium, and alloys thereof; conductive metal oxides, such as zinc oxide, tin oxide, indium oxide, and gallium oxide; conductive metal complex oxides, such as indium tin complex oxide (ITO), indium zinc complex oxide (IZO), aluminum zinc complex oxide (AZO), and gallium zinc complex oxide (GZO); conductive polymers, such as polyaniline, polypyrrole, polythiophene, and polyacetylene, and conductive polymers doped with acids, e.g., hydrochloric acid, sulfuric acid, and sulfonic acid, Lewis acids, e.g., phosphorus pentafluoride, arsenic pentafluoride, and iron chloride, halogen elements, e.g., iodine, and metals, e.g., sodium and potassium; and conductive composite materials containing carbon black and metal particles dispersed. Alternatively, polymer mixtures containing conductive particles, such as fine metal particles and graphite, may be used. These materials may be used alone or in combination.

(iii) Insulating Layer 1013

The insulating layer 1013 functions as a gate insulating layer. The insulating layer 1013 may be made, for instance, of any material having insulative properties. Examples of the material that can be used include organic insulating materials and inorganic insulating materials.

Examples of organic insulating materials include acrylic resins, phenolic resins, fluororesins, epoxy resins, imide resins, and novolac type resins.

Examples of inorganic insulating materials include: metal oxides, such as silicon oxide, aluminum oxide, tantalum oxide, zirconium oxide, cerium oxide, zinc oxide, and cobalt oxide; metal nitrides, such as silicon nitride, aluminum nitride, zirconium nitride, cerium nitride, zinc nitride, cobalt nitride, titanium nitride, and tantalum nitride; and metal complex oxides, such as barium strontium titanate and lead zirconate titanate. These may be used alone or in combination.

Further, the insulating layer 1013 may have a surface thereof processed by using a surface treatment agent (ODTS OTS HMDS βPTS) or the like.

(iv) Source Electrodes 1014a, 1014b, and Drain Electrodes 1014c, 1014d

The source electrodes 1014a, 1014b and the drain electrodes 1014c, 1014d can be formed by using the same materials as used for forming the gate electrodes 1012a, 1012b.

(v) Organic Semiconductor Layers 1017a, 1017b

The organic semiconductor layers 1017a, 1017b may be formed by using, for instance, any material that has semiconducting properties and is soluble to a solvent. Specific examples thereof include thiophene-based materials, such as poly(3-alkylthiophene), poly(3-hexylthiophene) (P3HT), poly(3-octylthiophene), poly(2,5-thienylene vinylene) (PTV), quarterthiophene (4T), sexithiophene (6T), octathiophene, 2,5-bis(5'-biphenyl-2'-thienyl)thiophene (BPT3), 2,5-[2,2'-(5,5'-diphenyl)dithienyl]thiophene, and [5,5'-bis(3-dodecyl-2-thienyl)-2,2'-bithiophene] (PQT-12); phenylene vinylene-based materials such as poly(paraphenylene vinylene) (PPV); fluorene-based materials such as poly(9,9-dioctylfluorene) (PFO); triallylamine-based polymers; acene-based materials, such as anthracene, tetracene, pentacene, and hexacene; benzene-based materials, such as 1,3,5-tri [(3-phenyl-6-trifluoromethyl)quinoxalin-2-yl]benzene (TPQ1) and 1,3,5-tris[{3-(4-tert-butylphenyl)-6-trisfluoromethyl}quinoxalin-2-yl]benzene (TPQ2); phthalocyanine-based materials, such as phthalocyanine, copper phthalocyanine (CuPc), iron phthalocyanine, and perfluorophthalocyanine; organometallic materials, such as tris(8-hydroxyquinoline) aluminum (Alq3) and fac-tris(2-phenylpyridine) iridium (Ir(ppy)3); C60; polymers, such as, oxadiazole-based polymers, triazole-based polymers, carbazole-based polymers, and fluorene-based polymers; poly(9,9-dioctylfluorene-co-bis-N,N-(4-methoxyphenyl)-bis-N,N'-phenyl-1,4-pheny lenediamine) (PFMO); poly(9,9-dioctylfluorene-co-benzothiadiazole) (BT); fluorene-triallylamine copolymers; and copolymers of fluorene and poly(9,9-dioctylfluorene-co-dithiophene) (F8T2). These materials may be alone or in combination.

Alternatively, the organic semiconductor layers 1017a, 1017b may be formed by using an inorganic material that is soluble in a solvent.

(v) Passivation. Film 1018

The passivation film 1018 may be formed by using, for instance, a water soluble resin such as polyvinyl alcohol (PVA), or a fluororesin.

(vii) Planarizing Film 102

The planarizing film 102 is formed by using, for instance, an organic compound such as polyimide, polyamide, and acrylic resin material.

(viii) Anode 103

The anode 103 is made of a metal material containing silver (Ag) or aluminum (Al). Further, in a top-emission type display panel such as the organic EL display panel 10 pertaining to the present embodiment, it is desirable that a surface portion of the anode 103 have high reflectivity.

(ix) Light-Transmissive Conduction Film 104

The light-transmissive conduction film 104 is formed by using, for instance, Indium Tin Oxide (ITO), Indium Zinc Oxide (IZO), or the like.

(x) Hole Injection Layer 105

The hole injection layer 105 is a layer made of, for instance, an oxide of a metal such as silver (Ag), molybdenum (Mo), chromium (Cr), vanadium (V), tungsten (W), nickel (Ni), and iridium (Ir), or a conductive polymer material such as PEDOT (an amalgam of polythiophene and polystyrene sulfonic acid). The hole injection layer 105 in the organic EL display panel 10 pertaining to the present embodiment as illustrated in FIG. 2 is assumed to be made of a metal oxide. In such a case, the hole injection layer 105 is provided with a function of assisting hole generation and injecting holes into the organic light-emitting layer 108 with a higher level of stability, compared to when the hole injection layer 105 is made of a conductive polymer material such as PEDOT. As such, the hole injection layer 105, when made of a metal oxide, has a higher work function than the hole injection layer 105, when made of a conductive polymer material.

Here, a case where the hole injection layer 105 is made of an oxide of a transition metal is considered. In such a case, a plurality of levels can be occupied since there are a plurality of oxidation numbers. This makes hole injection easy and allows for reduction of driving voltage. It is particularly desirable to form the hole injection layer 105 by using tungsten oxide ($WO_x$) since the hole injection layer 105 can be provided with the function of stably injecting holes and assisting the generation of holes.

(xi) Banks 106

The banks 106 are formed by using an organic material such as resin and have insulative properties. Example of organic material usable for forming the banks 106 include acrylic resins, polyimide resins, and novolac type phenolic resin. In addition, it is desirable that the banks 106 have organic solvent resistance. Further, since the banks 106 may undergo processes such as etching, baking, etc. when being formed, it is desirable that the banks 106 be formed from highly resistant material that will not change excessively in shape or quality during such processes. In addition, to provide the banks 106 with liquid repellency, the surfaces thereof can be fluoridated.

This is since, if a liquid-philic material is used to form the banks 106, the difference in liquid philicity/liquid repellency between the surfaces of the banks 106 and the surface of organic light-emitting layer 108 becomes small, and it thus becomes difficult to keep ink including an organic substance for forming the organic light-emitting layer 108 to be selectively held within the apertures defined by the banks 106.

In addition, the banks 106 need not be formed so as to have a single-layer structure as shown in FIG. 2. That is, the banks 106 may be alternatively formed so as to have a structure including two or more layers. In such a case, the above materials may be combined for each layer, or layers may alternate between inorganic and organic material.

(xii) Hole Transport Layer 107

The hole transport layer 107 is formed by using a high-molecular compound not containing a hydrophilic group. For instance, the hole transport layer 107 may be formed by using a high-molecular compound such as polyfluorene or a derivative thereof, and polyallylamine or a derivative thereof, but not containing a hydrophilic group.

(xiii) Organic Light-emitting Layer 108

The organic light-emitting layer 108 has a function of emitting light when an excitation state is produced by the recombination of holes and electrons injected thereto. It is desirable that material used to form the organic light-emitting layer 108 is a light emitting-organic material, a film of which can be formed by wet printing.

Specifically, it is desirable that the organic light-emitting layer 108 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(xiv) Electron Transport Layer 109

The electron transport layer 110 has a function of transporting electrons injected through the cathode 111 to the organic light-emitting layer 108, and is formed by using, for instance, an oxadiazole derivative (OXD), a triazole derivative (TAZ), a phenanthroline derivative (BCP, Bphen), or the like.

(xv) Cathode 110

The cathode 110 is formed by using, for instance, Indium Tin Oxide (ITO), Indium Zinc Oxide (IZO), or the like. Further, in a top-emission type display panel such as the organic EL display panel 10 pertaining to the present embodiment, it is desirable that the cathode 110 be formed by using light-transmissive material. When forming the cathode 111 by using light-transmissive material as described above, it is desirable that the cathode 111 be provided with light-transmissivity of 80% or greater.

In addition to the materials presented above, the following materials may be used to form the cathode 110. That is, the cathode 110 may be formed, for instance, as a layer including an alkali metal, a layer including an alkali earth metal, or a layer including an alkali earth metal halide. Alternatively, the cathode 110 may be formed as a laminate including one of the above-described layers and a layer including Ag laminated in the stated order. When the cathode 110 is formed as a laminate as described above, the layer including Ag may be formed with Ag alone, or with an alloy of Ag. Further, in order to enhance the efficiency with which light is guided out from the organic EL display panel 10, a highly light-transmissive, refraction index adjustment layer may be provided above the layer including Ag.

(xvi) Sealing Layer 111

The sealing layer 111 has a function of preventing organic layers such as the organic light-emitting layer 108 from being exposed to water and/or air and is formed by using, for example, material such as silicon nitride (SiN) and silicon oxynitride (SiON). In addition, a sealing resin layer made of a resin material such as acrylic resin and silicone resin may be further disposed above the sealing layer, which is formed by using material such as silicon nitride (SiN) and silicon oxynitride (SiON) as described above.

Further, in a top-emission type display panel such as the organic EL display panel 10 pertaining to the present embodiment, it is desirable that the sealing layer 111 be formed by using light-transmissive material.

4. Arrangement of Source Electrodes 1014a, 1014b and Drain Electrodes 1014c, 1014d in TFT Substrate 101

In the following, description is provided on a positional arrangement of the source electrodes 1014a, 1014b and the drain electrodes 1014c, 1014d in the TFT substrate 101, with reference to FIGS. 3A and 3B.

As illustrated in FIGS. 3A and 3B, at the bottom portion of each of the apertures 1016b, 1016c defined by the partition walls 1016, the corresponding one of the source electrodes 1014a, 1014b and the corresponding one of the drain electrodes 1014c, 1014d are disposed so as to be off-center in the Y axis direction. In specific, at the bottom portion of the aperture 1016b, each of the source electrode 1014a and the drain electrode 1014c is disposed so as to be offset in the lower direction along the Y axis. In other words, at the bottom portion of the aperture 1016b, a center of a total of areas of the source electrode 1014a and the drain electrode 1014c is offset from a center of area of bottom portion of the aperture 1016b in a direction differing from the direction of the adjacent aperture 1016a or that is, a direction differing from the left direction along the X axis.

On the other hand, at the bottom portion of the aperture 1016c, each of the source electrode 1014b and the drain electrode 1014d is disposed so as to be offset in the upper direction along the Y axis. In other words, at the bottom portion of the aperture 1016c, a center of a total of areas of the source electrode 1014b and the drain electrode 1014d is offset from a center of area of bottom portion of the aperture 1016c in a direction differing from the direction of the adjacent aperture 1016b or that is, a direction differing from the left direction along the X axis.

Note that each of "a center of a total of areas of the source electrode 1014a and the drain electrode 1014c" and "a center of a total of areas of the source electrode 1014b and the drain electrode 1014d" as mentioned above can be calculated according to Math. 1 above.

In addition, each of the source electrode 1014a and the drain electrode 1014c is in contact with a lower side, in the Y axis direction, of a side surface portion, of the partition walls 1016, facing the aperture 1016b while being located apart from the rest of the sides of the side surface portion facing the aperture 1016b. Similarly, at the bottom portion of the aperture 1016c, each of the source electrode 1014b and the drain electrode 1014d is in contact with an upper side, in the Y axis direction, of a side surface portion, of the partition walls 1016, facing the aperture 1016c while being located apart from the rest of the sides of the side surface portion facing the aperture 1016c.

In addition, as illustrated in FIG. 3B, at a point when the organic semiconductor layer 1017a has not yet been formed, at the bottom portion of the aperture 1016b, a center of areas of portions of the insulating layer 1013 remaining exposed (a center of areas of the exposed portions 1013a, 1013b, 1013e) is offset from the center of area of the bottom portion of the aperture 1016b in the upper direction along the Y axis. Similarly, at a point when the organic semiconductor layer 1017b has not yet been formed, at the bottom portion of the aperture 1016c, a center of areas of portions of the insulating layer 1013 remaining exposed (a center of areas of the exposed portions 1013c, 1013d, 10130 is offset from the center of area of the bottom portion of the aperture 1016c in the lower direction along the Y axis.

5. Method of Manufacturing Organic Display Device 1

In the following, description is provided on a method of manufacturing the organic EL display device 1, and in particular, a method of manufacturing the organic EL display panel 10, with reference to FIG. 2 and FIGS. 4A and 4B.

First, as illustrated in FIG. 2 and FIG. 4A, the substrate 1011 is prepared (Step S1). The substrate 1011 serves as a base of the TFT substrate 101. Then, the TFT substrate 101 is formed by forming a thin film transistor (TFT) device on the substrate 1011 (Step S2).

Then, as illustrated in FIG. 2 and FIG. 4A, the planarizing film 102, which is made of insulative material, is formed on the TFT substrate 101 (Step S3). As illustrated in FIG. 2, the planarizing film 102 has the contact hole 102a formed therein at an area above the connection wire 1015 in the TFT substrate 101. Further, the planarizing film 102 is formed such that upper surfaces in the Z axis direction of portions thereof other than the contact hole 102a are substantially planar.

Then, the anode 103 is formed on the planarizing film 102 (Step S4). As illustrated in FIG. 2, the anode 103 in the organic EL display panel 10 is formed so as to be partitioned in units of light emission (i.e., in units of subpixels). Further, the anode 103 is formed so as to have a portion that is connected to the connection wire 1015 of the TFT substrate 101 by being formed along the side surface of the planarizing film 102 defining the contact hole 102a.

Here, note that the anode 103 can be formed, for instance, by first forming a metal film according to the sputtering method, the vacuum vapor deposition method, or the like, and then etching the metal film so formed to obtain subpixel units.

Then, the light-transmissive conduction film 104 is formed so as to cover an upper surface of the anode 103 (Step S5). As illustrated in FIG. 2, the light-transmissive conduction film 104 covers not only the upper surface of the anode 103 but also surfaces of lateral edges of the anode 103. Further, the light-transmissive conduction film 104 also covers the upper surface of the anode 103 within the contact hole 102a. Note that the light-transmissive conduction film 104 can also be formed, for instance, by first forming a film according to the sputtering method, the vacuum vapor deposition method, or the like, and then etching the film so formed to obtain subpixel units.

Then, the hole injection layer 105 is formed on the light-transmissive conduction film 104 (Step S6). Note that, although the hole injection layer 105 is formed so as to cover the entire light-transmissive conduction film 104 in FIG. 2, the hole injection layer 105 may alternatively be formed so as to be partitioned into subpixel units.

Further, when forming the hole injection layer 105 by using a metal oxide (e.g., tungsten oxide), the formation of the metal oxide film can be performed according to specific film forming conditions. For instance, the metal oxide film can be formed under film forming conditions such that: (i) a gas including argon gas and oxygen gas is used as a sputtering gas in a chamber of a sputtering device for forming the metal oxide film; (ii) a total pressure of the sputtering gas is higher than 2.7 Pa and lower than or equal to 7.0 Pa; (iii) a partial pressure of the oxygen gas in the sputtering gas is at least 50% and at most 70%; and (iv) an input power density per unit area of the sputtering target is at least $1.0$ $W/cm^2$ and at most $2.8$ $W/cm^2$.

Then, the banks 106 defining subpixels of the organic EL display panel 10 are formed (Step S7). As illustrated in FIG. 2, the banks 106 are formed so as to be layered onto the hole injection layer 105.

In specific, the banks 106 are formed by first forming a layer of material for forming the banks 106 (hereinafter referred to as a "material layer") on the hole injection layer 105. The material layer is formed, for instance, by using a material including a photosensitive resin component and a fluorine component such as acrylic resin, polyimide resin, and novolac-type phenolic resin, and according to the spin coating method, or the like. Note that, in the present embodiment, a negative photosensitive material manufactured by Zeon Corporation (product code: ZPN1168), which is one example of a photosensitive resin material, can be used for forming the material layer. Subsequently, by patterning the material layer so formed, apertures corresponding to the subpixels of the organic EL display panel 10 are formed. The forming of the apertures can be performed by disposing a mask onto the surface of the material layer, performing exposure from over the mask, and finally performing developing.

Then, in each concavity on the hole injection layer 105 defined by the banks 106, the hole transport layer 107, the organic light-emitting layer 108, and the electron transport layer 109 are formed in the stated order so as to be layered one on top of another (Steps S8 through S10).

The hole transport layer 107 is formed by first forming, according to the printing method, a film made of an organic compound for forming the hole transport layer 107, and then sintering the film so formed. The organic light-emitting layer 108 is similarly formed by first forming a film according to the printing method, and then sintering the film so formed.

Then, the cathode 110 and the sealing layer 111 are layered onto the electron transport layer 109 in the stated order (Steps S11 and S12). As illustrated in FIG. 2, the cathode 110 and the sealing layer 111 are formed so as to cover the layers therebelow entirely, including top surfaces of the banks 106.

Then, an adhesive resin material for forming the adhesion layer 112 is applied onto the sealing layer 111, and a color filter (CF) panel having been prepared in advance is adhered onto the sealing layer 111 via the adhesive layer 112 (Step S13). As illustrated in FIG. 2, the CF substrate 113 adhered onto the sealing layer 111 via the adhesion layer 112 includes the substrate 1131, and the color filter 1132 and the black matrix 1133 formed on the surface of the substrate 1131 that is located lower in the Z axis direction.

As such, the manufacturing of the organic EL display panel 10, which is an organic EL display element, is completed.

Note that, although illustration is not provided in the drawings, the manufacturing of the organic EL display device 1 is completed by annexing the drive control circuit portion 20 to the organic EL display panel 10 (refer to FIG. 1), and then performing aging processing. The aging processing is performed by, for instance, causing the organic EL display device 1 to conduct until the mobility of holes in the organic EL display device 1 reaches 1/10 or lower with respect to the hole injection characteristics before the aging processing. More specifically, in the aging processing, the organic EL display device 1 is electrified for a predetermined time period while maintaining the luminous intensity of the organic EL display device 1 to be at least equal to the luminous intensity upon actual usage and at most three times the luminous intensity upon actual usage.

Subsequently, description is provided on a method of forming the TFT substrate 101, with reference to FIG. 4B, FIGS. 5A through 5C, FIGS. 6A through 6C, FIGS. 7A through 7C, and FIGS. 8A and 8B.

As illustrated in FIG. 5A, the gate electrodes 1012a, 1012b are formed on a main surface of the substrate 1011 (Step S21 in FIG. 4B). Note that the formation of the gate electrodes 1012a, 1012b may be performed according to the above-described method applied in the formation of the anode 103.

Then, as illustrated in FIG. 5B, the insulating layer 1013 is formed so as to cover the substrate 1011 and the gate electrodes 1012a, 1012b (Step S22 in FIG. 4B). Then, as illustrated in FIG. 5C, the source electrodes 1014a, 1014b, the drain electrodes 1014c, 1014d, and the connection wire 1015 are formed on a main surface of the insulating layer 1013 (Step S23 in FIG. 4B). In this step, note that the position of each of the source electrodes 1014a, 1014b and each of the drain electrodes 1014c, 1014d on the insulating layer 1013 is defined such that, in each of the apertures 1016b, 1016c, a corresponding one of the source electrodes 1014a, 1014b and the corresponding one of the drain electrodes 1014c, 1014d are disposed so as to be offset in the manner described above. Such arrangements are made in the present step taking into account the partition walls 1016 that are formed through the following steps. Due to this, the exposed portion 1013a of the insulating layer 1013 is formed at the left side of the source electrode 1014a in the X axis direction, and the exposed portion 1013b of the insulating layer 1013 is formed at the right side of the drain electrode 1014c in the X axis direction. Similarly, the exposed portion 1013c of the insulating layer 1013 is formed at the left side of the source electrode 1014b in the X axis direction, and the exposed portion 1013d of the insulating layer 1013 is formed at the right side of the drain electrode 1014d in the X axis direction. Note that, although undepicted in FIG. 5C, the exposed portions 1013e, 1013f of the insulating layer 1013 are also formed in this step.

Then, as illustrated in FIG. 6A, a film 10160 of photoresist material for forming the partition walls 1016 is deposited so as to accumulate and cover the source electrodes 1014a, 1014b, the drain electrodes 1014c, 1014d, the connection wire 1015, and the exposed portions 1013a, 1013b of the insulating layer 1013 (Step S24 in FIG. 4B). Then, as illustrated in FIG. 6B, a mask 501 is disposed above the film 10160 so deposited, and mask exposure and patterning of the photoresist material film 10160 is performed (Step S25 in FIG. 4B). Here, note that the mask 501 has window portions 501a, 501b, 501c, and 501d formed therein which correspond in position to the partition walls 1016 to be formed. Note that, although not illustrated in FIG. 6B, the mask 501 has additional window portions formed therein which also correspond in position to the partition walls 1016 to be formed.

The partition walls 1016, illustration of which is provided in FIG. 6C, are formed in such a manner as described above (Step S26 in FIG. 4B). The partition walls 1016 define a plurality of apertures including the apertures 1016a, 1016b, and 1016c. More specifically, the partition walls 1016 defining the aperture 1016a surround the connection wire 1015, the partition walls 1016 defining the aperture 1016b surround the source electrode 1014a and the drain electrode 1014c, and the partition walls 1016 defining the aperture 1016e surround the source electrode 1014b and the drain electrode 1014d. Further, in each of the apertures 1016b, 1016c, the corresponding one of the source electrodes 1014a, 1014b and the corresponding one of the drain electrodes 1014c, 1014d are each disposed so as to be offset as illustrated in FIG. 3A.

Figure 7A:
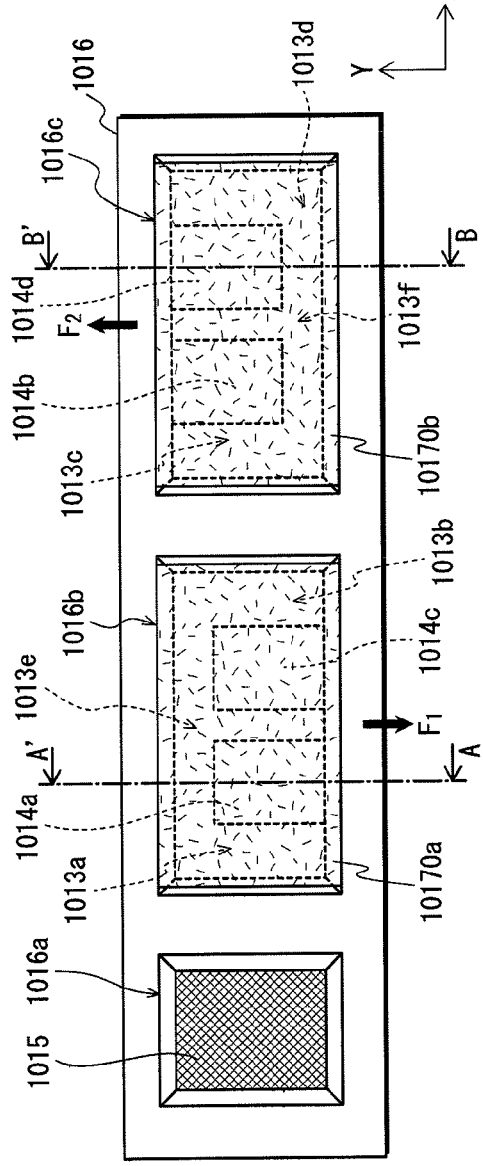
FIG. 7A is a schematic plan view illustrating a procedure among procedures involved in the manufacturing of the TFT substrate 101.

After the partition walls 1016 are formed, organic semiconductor ink 10170a, 10170b, for respectively forming the organic semiconductor layers 1017a, 1017b, are respectively applied to the apertures 1016b, 1016c defined by the partition walls 1016, as illustrated in FIG. 7A (Step S27 in FIG. 4B). Here, it should be noted that a plan view surface of the organic semiconductor ink 10170a applied with respect to the aperture 1016b and a plan view surface of the organic semiconductor ink 10170a applied with respect to the aperture 1016b are not symmetric in the X axis direction in FIG. 7A. Rather, the plan view surface of the organic semiconductor ink 10170a and the plan view surface of the organic semiconductor ink 10170a are off-center in different directions (the directions indicated by arrows $F_1$ and $F_2$ in FIG. 7A).

Figure 7B:
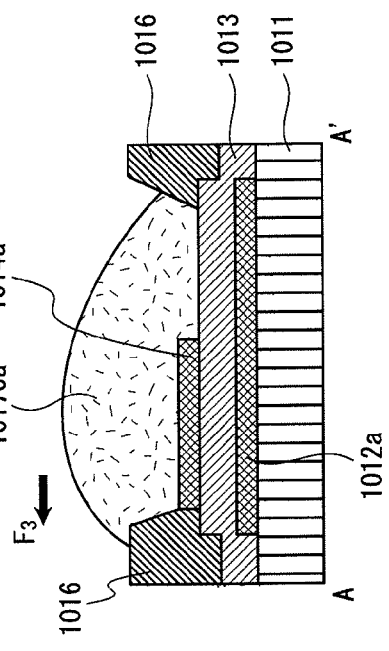
FIG. 7B is a schematic cross-sectional view illustrating a structure along a cross section A-A' in FIG. 7A.
Figure 7C:
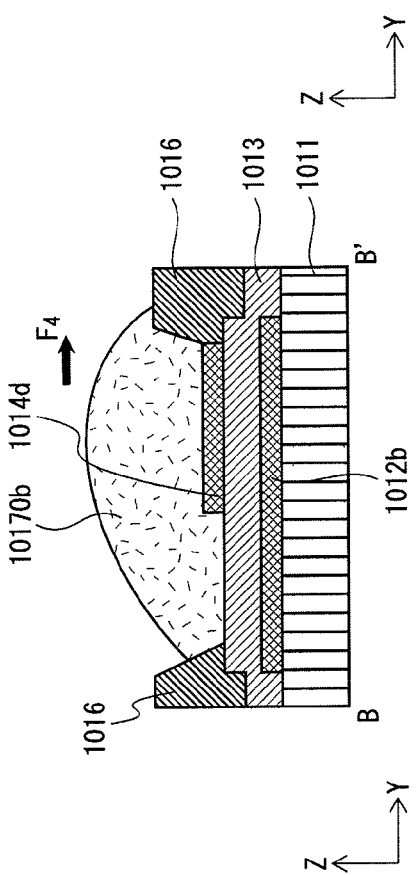
FIG. 7C is a schematic cross-sectional view illustrating a structure along a cross section B-B' in FIG. 7A.

More specifically, as illustrated in FIG. 7B, the surface shape of the organic semiconductor ink 10170a applied with respect to the aperture 1016b is biased in one direction along the Y axis (i.e., the direction indicated by the arrow $F_3$ illustrated above the organic semiconductor ink 10170a). In other words, the organic semiconductor ink 10170a applied with respect to the aperture 1016b has a shape such that one side along the Y axis in the direction indicated by the arrow $F_3$ includes a greater distribution of portions having relatively great surface height than the other side. On the other hand, as illustrated in FIG. 7C, the surface shape of the organic semiconductor ink 10170b applied with respect to the aperture 1016c is biased in one direction along the Y axis (i.e., the direction indicated by the arrow $F_4$ illustrated above the organic semiconductor ink 10170b). In other words, the organic semiconductor ink 10170b applied with respect to the aperture 1016c has a shape such that one side along the Y axis in the direction indicated by the arrow $F_4$ includes a greater distribution of portions having relatively great surface height than the other side.

By controlling the surface shapes of the organic semiconductor ink 10170a, 10170b in such a manner, the organic semiconductor ink 10170a, 10170b is (i) prevented from overflowing and flowing out towards undesirable areas including the aperture 1016a, and (ii) prevented from meeting and blending with each other. The specific reasons as to why such a problem can be prevented are described later in the present disclosure.

Figure 8A:
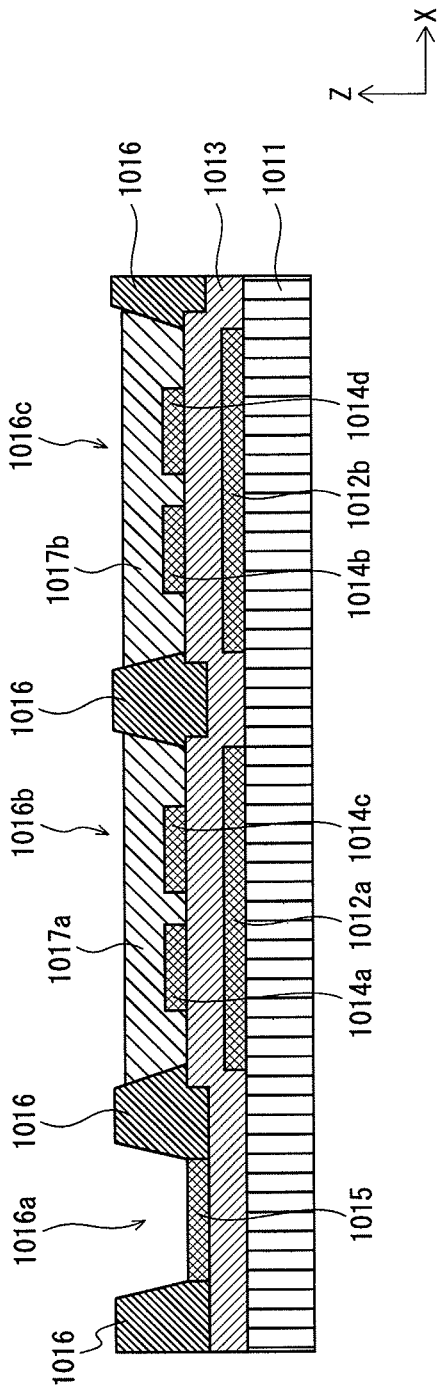
FIGS. 8A and 8B are schematic process diagrams illustrating some procedures among procedures involved in the manufacturing of the TFT substrate 101.

Subsequently, by drying the organic semiconductor ink 10170a, 10170b (Step S28 in FIG. 4B), the organic semiconductor layers 1017a, 1017b are respectively formed with respect to the apertures 1016b, 1016c as illustrated in FIG. 8A (Step S29 in FIG. 4B).

Figure 8B:
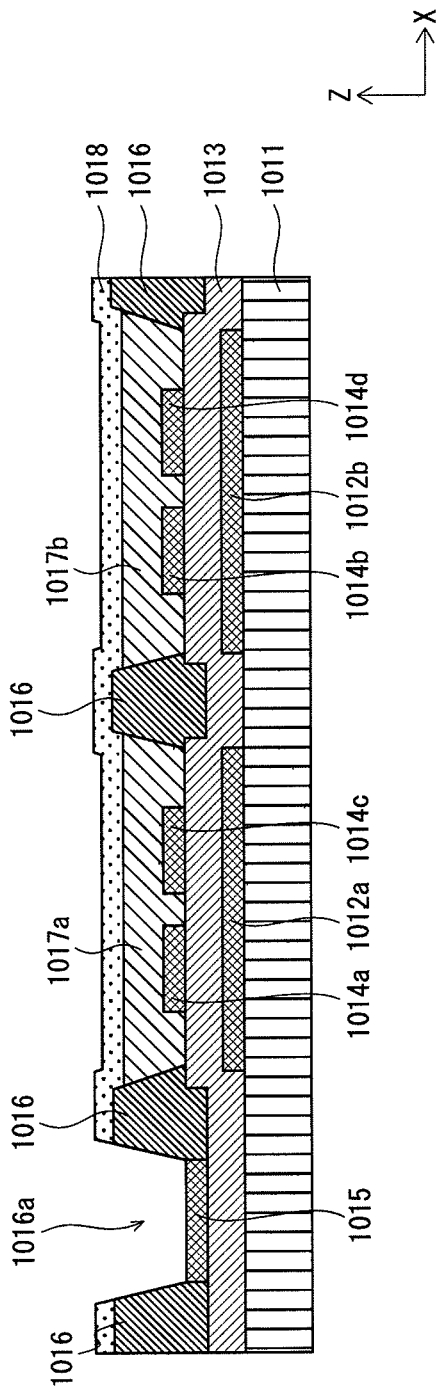

Finally, the formation of the TFT substrate 101 is completed by forming the passivation film 1018 so as to entirely cover underlayers therebelow with the exception of a contact area including the aperture 1016a, etc., as illustrated in FIG. 8B (Step S30 in FIG. 4B).

6. Effects Achieved

For the reasons explained in the following, the TFT substrate 101 pertaining to the present embodiment, the organic EL display panel 10 including the TFT substrate 101, and the organic EL display device 1 having a structure including the organic EL display panel 10 are ensured to have high quality, and at the same time, to have high yield in the manufacture thereof.

As illustrated in FIGS. 7A through 7C, according to the TFT substrate 101 pertaining to the present embodiment, when the organic semiconductor ink 10170*a*, 10170*b*, which are for respectively forming the organic semiconductor layers 1017*a*, 1017*b*, are respectively applied with respect to the apertures 1016*b*, 1016*c*, the organic semiconductor ink 10170*a* exhibits a shape such that the above-described side thereof, which is not in the direction along which the aperture 1016*a* adjacent to the aperture 1016*b* exists, includes a great distribution of portions having great surface height. Due to this, it is unlikely that the organic semiconductor ink 10170*a* flows out towards the aperture 1016*a*.

In addition, when comparing the organic semiconductor ink 10170*a* applied with respect to the aperture 1016*b* and the organic semiconductor ink 10170*b* applied with respect to the aperture 1016*c*, portions having great surface height are located at opposite sides in the Y axis direction. Due to this, it is unlikely that the organic semiconductor ink 10170*a* and the organic semiconductor ink 10170*b* meet and blend with each other.

As such, in the TFT substrate 101 pertaining to the present embodiment, the formation of the organic semiconductor layers 1017*a*, 1017*b* at only desired areas (i.e., the channel portions) is realized. In addition, by preventing the organic semiconductor ink 10170*a*, 10170*b* from overflowing, the layer thicknesses of the organic semiconductor layers 1017*a* and 1017*b* (i.e., the layer thickness of an organic semiconductor layer 1017) can be controlled with high precision. Furthermore, high performance is guaranteed of each of a thin film transistor element formed at an area corresponding to the aperture 1016*b* and a thin film transistor element formed at an area corresponding to the aperture 1016*c*.

As such, the TFT substrate 101 pertaining to the present embodiment, the organic EL display panel 10 including the TFT substrate 101, and the organic EL display device 1 having a structure including the organic EL display panel 10, upon formation of the organic semiconductor layer 1017 in the TFT substrate 101, (i) prevents the formation of the organic semiconductor layer 1017 at undesirable areas, and (ii) prevents the organic semiconductor ink 10170*a*, 10170*b* from meeting and blending with each other, and thereby ensures high quality.

Note that the above-described effect is a result of (i) the positional arrangement of the source electrodes 1014*a*, 1014*b* and the drain electrodes 1014*c*, 1014*d* at the bottom portion of the apertures 1016*b*, 1016*c*, and (ii) a specific relationship between the liquid repellency of the surfaces of the partition walls 1016, the liquid repellency of the surface of the insulating layer 1013, and the liquid repellency of the surfaces of the source electrodes 1014*a*, 1014*b* and the drain electrodes 1014*c*, 1014*d*. In specific, the following relationship is satisfied when denoting: the liquid repellency of the surfaces of the partition walls 1016 as Rw; the liquid repellency of the surface of the insulating layer 1013 as $R_I$; and the liquid repellency of the surfaces of the source electrodes 1014*a*, 1014*b* and the drain electrodes 1014*c*, 1014*d* as $R_E$.

$$R_W > R_I > R_E \qquad \text{[Math. 2]}$$

Note that, the liquid repellency denoted by each of $R_W$, $R_I$, and $R_E$ indicates the liquid repellency of the corresponding surface(s) with respect to the organic semiconductor ink 10170*a*, 10170*b*.

In the meantime, when seen from an opposite point of view, or that is, in terms of wettability, the characteristics of the surfaces of the partition walls 1016, the characteristics of the surface of the insulating layer 1013, and the characteristics of the surfaces of the source electrodes 1014*a*, 1014*b* and the drain electrodes 1014*c*, 1014*d* satisfy the following relationship.

$$W_W < W_I < W_E \qquad \text{[Math. 3]}$$

In Math. 3, $W_W$, denotes the wettability of the surfaces of the partition walls 1016, $W_I$ denotes the wettability of the surface of the insulating layer 1013, and $W_E$ denotes the wettability of the surfaces of the source electrodes 1014*a*, 1014*b* and the drain electrodes 1014*c*, 1014*d*.

As described up to this point, according to the present embodiment, control is performed of (i) the positional arrangement of the source electrodes 1014*a*, 1014*b* and the drain electrodes 1014*c*, 1014*d* at the bottom portions of the apertures 1016*b*, 1016*c*, and (ii) the relationship between the liquid repellency of the surfaces of the partition walls 1016, the liquid repellency of the surface of the insulating layer 1013, and the liquid repellency of the surfaces of the source electrodes 1014*a*, 1014*b* and the drain electrodes 1014*c*, 1014*d*. Due to this, the surfaces of the organic semiconductor ink 10170*a*, 10170*b*, upon application in the manufacturing of the TFT substrate 101, exhibit the shapes as illustrated in FIGS. 7A through 7C. Hence, the organic semiconductor ink 10170*a*, 10170*b* can be (i) effectively prevented from overflowing and flowing out towards undesirable areas such as the inside of the aperture 1016*a* and (ii) effectively prevented from meeting and blending with each other. This results in the formation of the organic semiconductor layers 1017*a*, 1017*b* at undesirable portions being prevented and the degradation of device characteristics due to meeting and blending of organic semiconductor ink between thin film transistor elements being prevented. As such, the TFT substrate 101, the organic EL display panel 10, and the organic EL display device 1 are ensured to have high quality, and at the same time, to have high yield in the manufacture thereof.

Note that, by disposing the source electrode 1014*a* and the drain electrode 1014*c* at the bottom portion of the aperture 1016*b* and the source electrode 1014*b* and the drain electrode 1014*d* at the bottom portion of the aperture 1016*c* according to the positional arrangement illustrated in FIG. 3A, the exposed portions 1013*a*, 1013*b*, 1013*e* of the insulating layer 1013 are formed at the bottom portion of the aperture 1016*b* and the exposed portions 1013*c*, 1013*d*, 1013*f* of the insulating layer 1013 are formed at the bottom portion of the aperture 1016*c* as illustrated in FIG. 3B. As a result, at the bottom portion of the aperture 1016*b*, the area of the insulating layer 1013 remaining exposed is greater at the upper side of the bottom portion in the Y axis direction than at the lower side. On the other hand, at the bottom portion of the aperture 1016*c*, the area of the insulating layer 1013 remaining exposed is greater at the lower side of the bottom portion in the Y axis direction than at the upper side. Such a relationship is also effective in achieving the above-described effects.

Embodiment 2

Figure 9A:
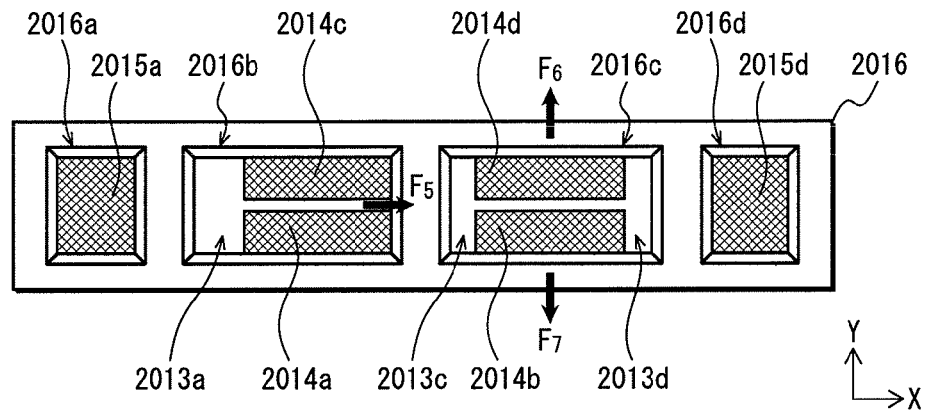
FIG. 9A is a schematic plan view illustrating, in a structure of an organic EL display panel pertaining to embodiment 2, a partial structure of a TFT substrate.

In the following, description is provided on a structure of a TFT substrate pertaining to embodiment 2 of the present disclosure, with reference to FIG. 9A. FIG. 9A corresponds to FIG. 3A in embodiment 1, and other than differences between the structures illustrated in FIG. 9A and FIG. 3A, embodiment 2 is similar to embodiment 1. As such, the structures similar between embodiment 2 and embodiment 1 are not illustrated in the drawings nor will be described in the following.

As illustrated in FIG. 9A, the TFT substrate pertaining to the present embodiment has partition walls 2016 that define four apertures, namely apertures 2016a, 2016b, 2016c, 2016d. Among the four apertures that are defined by the partition walls 2016, the apertures 2016a, 2016d are respectively provided with connection wires 2015a, 2015d at bottom portions thereof, and thus, do not function as channel portions.

Note that, as illustrated in FIG. 9A, one of the apertures 2016a, 2016d, which do not function as channel portions, here for instance, the aperture 2016d belongs to a TFT element that corresponds to a subpixel adjacent to a subpixel that the apertures 2016a through 2016c correspond to.

In addition, at the bottom portion of the aperture 2016b, a source electrode 2014a and a drain electrode 2014c are disposed. Similarly, at the bottom portion of the aperture 2016c, a source electrode 2014b and a drain electrode 2014d are disposed.

The source electrode 2014a and the drain electrode 2014c at the bottom portion of the aperture 2016b, and the source electrode 2014b and the drain electrode 2014d at the bottom portion of the aperture 2016c have a shape of an elongated rectangle whose long sides extend in the X axis direction. Further, one long side of the source electrode 2014a faces one long side of the drain electrode 2014c, and similarly, one side long of the source electrode 2014b faces one long side of the drain electrode 2014d.

In addition, at the bottom portion of the aperture 2016b before the formation of an organic semiconductor layer, a portion of an insulating layer 2013 remaining exposed (i.e., an exposed portion 2013a) occupies a greater area in the left side of the bottom portion in the X axis direction compared to in the right side, as illustrated in portion (a) of FIG. 9. On the other hand, at the bottom portion of the aperture 2016c before the formation of an organic semiconductor layer, portions of the insulating layer 2013 remaining exposed at both sides of the bottom portion in the X axis direction (i.e., exposed portions 2013c, 2013d) occupy substantially the same area.

In the manufacturing of the TFT substrate pertaining to the present embodiment that has the above-described structure, when organic semiconductor ink is applied with respect to the apertures 2016b, 2016c, the organic semiconductor ink exhibits a state as described in the following. That is, the surface shape of the organic semiconductor ink applied with respect to the aperture 2016b is biased in the direction indicated by the arrow $F_5$. On the other hand, the surface shape of the organic semiconductor ink applied with respect to the aperture 2016c is biased in the two directions indicated by the arrows $F_6$ and $F_7$.

As such, the structure according to the present embodiment achieves the same effects as the structure described in embodiment 1, and therefore, similar as described in embodiment 1 above, an organic EL display panel and an organic EL display device including the TFT substrate pertaining to the present embodiment are ensured to have high quality, and at the same time, to have high yield in the manufacture thereof.

Embodiment 3

Figure 9B:
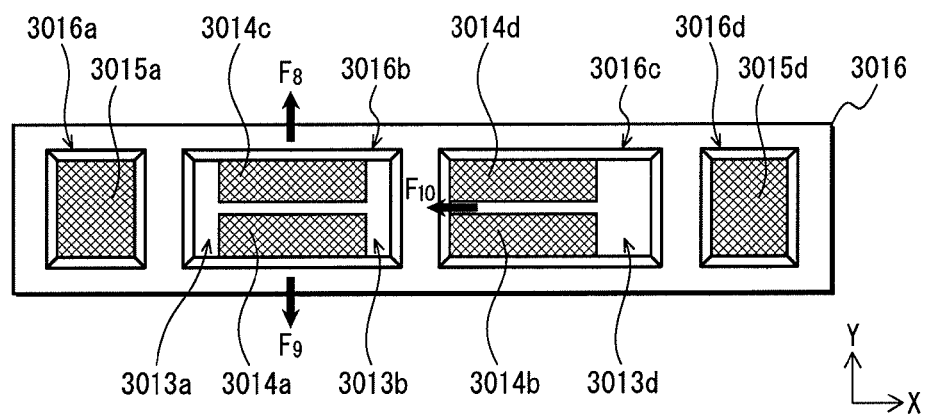
FIG. 9B is a schematic plan view illustrating, in a structure of an organic EL display panel pertaining to embodiment 3, a partial structure of a TFT substrate.

In the following, description is provided on a structure of a TFT substrate pertaining to embodiment 3 of the present disclosure, with reference to FIG. 9B. FIG. 9B corresponds to FIG. 3A in embodiment 1, and other than differences between the structures illustrated in FIG. 9B and FIG. 3A, embodiment 3 is similar to embodiments 1 and 2. As such, the structures similar between embodiment 3 and embodiments 1 and 2 are not illustrated in the drawings nor will be described in the following.

As illustrated in FIG. 9B, the TFT substrate pertaining to the present embodiment has partition walls 3016 that define four apertures, namely apertures 3016a, 3016b, 3016c, 3016d. Among the four apertures that are defined by the partition walls 3016, the apertures 3016a, 3016d are respectively provided with connection wires 3015a, 3015d at bottom portions thereof, and thus, do not function as channel portions.

Note that, as illustrated in FIG. 9B, one of the apertures 3016a, 3016d, which do not function as channel portions, here for instance, the aperture 3016d belongs to a TFT element that corresponds to a subpixel adjacent to a subpixel that the apertures 3016a through 3016c correspond to. This is similar to embodiment 2, etc.

In addition, at the bottom portion of the aperture 3016b, a source electrode 3014a and a drain electrode 3014c are disposed. Similarly, at the bottom portion of the aperture 3016c, a source electrode 3014b and a drain electrode 3014d are disposed.

The source electrode 3014a and the drain electrode 3014c at the bottom portion of the aperture 3016b, and the source electrode 3014b and the drain electrode 3014d at the bottom portion of the aperture 3016c each have a shape of an elongated rectangle whose long sides extend in the X axis direction. Further, one long side of the source electrode 3014a faces one long side of the drain electrode 3014c, and similarly, one side long of the source electrode 3014b faces one long side of the drain electrode 3014d.

At the bottom portion of the aperture 3016b before the formation of an organic semiconductor layer, portions of an insulating layer 3013 remaining exposed at both sides of the bottom portion in the X axis direction (i.e., exposed portions 3013a, 3013b) occupy substantially the same area. On the other hand, at the bottom portion of the aperture 3016c before the formation of an organic semiconductor layer, a portion of the insulating layer 3013 remaining exposed (i.e., an exposed portion 3013d) occupies a greater area in the right side of the bottom portion in the X axis direction compared to in the left side.

In the manufacturing of the TFT substrate pertaining to the present embodiment that has the above-described structure, when organic semiconductor ink is applied with respect to the apertures 3016b, 3016c, the organic semiconductor ink exhibits a state as described in the following. That is, the surface shape of the organic semiconductor ink applied with respect to the aperture 3016b is biased in the two directions indicated by the arrows $F_8$ and $F_9$. On the other hand, the surface shape of the organic semiconductor ink applied with respect to the aperture 3016c is biased in the direction indicated by the arrow $F_{10}$.

As such, the structure according to the present embodiment achieves the same effects as the structure described in embodiment 1, and therefore, similar as described in embodiment 1 above, an organic EL display panel and an organic EL display device including the TFT substrate pertaining to the present embodiment are ensured to have high quality, and at the same time, to have high yield in the manufacture thereof.

Embodiment 4

Figure 9C:
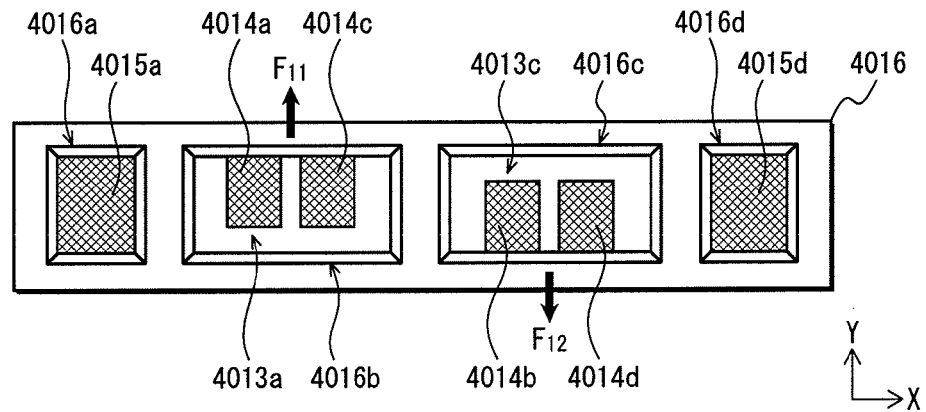
FIG. 9C is a schematic plan view illustrating, in a structure of an organic EL display panel pertaining to embodiment 4, a partial structure of a TFT substrate.

In the following, description is provided on a structure of a TFT substrate pertaining to embodiment 4 of the present disclosure, with reference to FIG. 9C. FIG. 9C corresponds to FIG. 3A in embodiment 1, and other than differences between the structures illustrated in FIG. 9C and FIG. 3A, embodiment 4 is similar to embodiments 1, 2, and 3. As such, the structures similar between embodiment 4 and embodiments 1, 2, and 3 are not illustrated in the drawings nor will be described in the following.

As illustrated in FIG. 9C, the TFT substrate pertaining to the present embodiment has partition walls 4016 that define four apertures, namely apertures 4016a, 4016b, 4016c, 4016d. Among the four apertures that are defined by the partition walls 4016, the apertures 4016a, 4016d are respectively provided with connection wires 4015a, 4015d at bottom portions thereof, and thus, do not function as channel portions.

Note that, as illustrated in FIG. 9C, one of the apertures 4016a, 4016d, which do not function as channel portions, here for instance, the aperture 4016d belongs to a TFT element that corresponds to a subpixel adjacent to a subpixel that the apertures 4016a through 4016c correspond to. This is similar to embodiments 2, 3, etc.

In addition, at the bottom portion of the aperture 4016b, a source electrode 4014a and a drain electrode 4014c are disposed. Similarly, at the bottom portion of the aperture 4016c, a source electrode 4014b and a drain electrode 4014d are disposed. Here, note that the source electrode 4014a and the drain electrode 4014c are disposed at the bottom portion of the aperture 4016b and the source electrode 4014b and the drain electrode 4014d are disposed at the bottom portion of the aperture 4016c such that the apertures 4016b, 4016c in the present embodiment and the apertures 1016b, 1016c in embodiment are symmetrical with respect to the Y axis. That is, at the bottom portion of the aperture 4016b, the source electrode 4014a and the drain electrode 4014c are disposed in a similar manner as in the aperture 1016c, and at the bottom portion of the aperture 4016c, the source electrode 4014b and the drain electrode 4014d are disposed in a similar manner as in the aperture 1016b.

The source electrode 4014a and the drain electrode 4014c at the bottom portion of the aperture 4016b, and the source electrode 4014b and the drain electrode 4014d at the bottom portion of the aperture 4016c each have a substantially square shape, similar as the source electrodes and drain electrodes in embodiment 1.

At the bottom portion of the aperture 4016b before the formation of an organic semiconductor layer, a portion of an insulating layer 4013 remaining exposed (i.e., an exposed portion 4013a) occupies a greater area in the lower side of the bottom portion in the Y axis direction compared to in the upper side. On the other hand, at the bottom portion of the aperture 4016c before the formation of an organic semiconductor layer, a portion of the insulating layer 4013 remaining exposed (i.e., an exposed portion 4013c) occupies a greater area in the upper side of the bottom portion in the Y axis direction compared to in the lower side.

In the manufacturing of the TFT substrate pertaining to the present embodiment that has the above-described structure, when organic semiconductor ink is applied with respect to the apertures 4016b, 4016c, the organic semiconductor ink exhibits a state as described in the following. That is, the surface shape of the organic semiconductor ink applied with respect to the aperture 4016b is biased in the direction indicated by the arrow $F_{11}$. On the other hand, the surface shape of the organic semiconductor ink applied with respect to the aperture 4016c is biased in the direction indicated by the arrow $F_{12}$.

As such, the structure according to the present embodiment achieves the same effects as the structure described in embodiment 1, and therefore, similar as described in embodiment 1 above, an organic EL display panel and an organic EL display device including the TFT substrate pertaining to the present embodiment are ensured to have high quality, and at the same time, to have high yield in the manufacture thereof.

Embodiment 5

In the following, description is provided on a structure of a TFT substrate pertaining to embodiment 5 of the present disclosure, with reference to FIG. 10A. Note that FIG. 10A is a diagram illustrating a portion of the TFT substrate pertaining to embodiment 5.

Figure 10A:
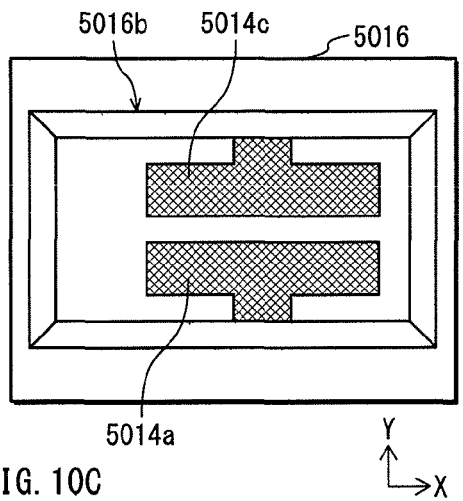
FIG. 10A is a schematic plan view illustrating, in a structure of an organic EL display panel pertaining to embodiment 5, a partial structure of a TFT substrate.

As illustrated in FIG. 10A, partition walls 5016 in the TFT substrate pertaining to the present embodiment defines an aperture 5016b. At a bottom portion of the aperture 5016b, a source electrode 5014a and a drain electrode 5014c are disposed. The source electrode 5014a and the drain electrode 5014c at the bottom portion of the aperture 5016b each have a T-shape in plan view. Further, in the aperture 5016b, a portion of the source electrode 5014a extending in the X axis direction faces a portion of the drain electrode 5014c extending in the X axis direction. Further, at the bottom portion of the aperture 5016b, a center of a total of areas of the source electrode 5014a and the drain electrode 5014c is offset from a center of area of the bottom portion of the aperture 5016b in the right direction along the X axis.

Due to such electrodes disposed in such an arrangement as described above being included in the TFT substrate pertaining to the present embodiment, a shape of a surface of semiconductor ink applied with respect to the aperture is controlled in a similar manner as in Claim 1. Hence, the organic semiconductor ink is prevented from overflowing and flowing out undesirably, and further, the meeting and blending of the semiconductor ink with semiconductor ink applied with respect to an adjacent aperture is prevented.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

Embodiment 6

In the following, description is provided on a structure of a TFT substrate pertaining to embodiment 6 of the present disclosure, with reference to FIG. 10B. Note that FIG. 10B is a diagram illustrating a portion of the TFT substrate pertaining to embodiment 6.

Figure 10B:
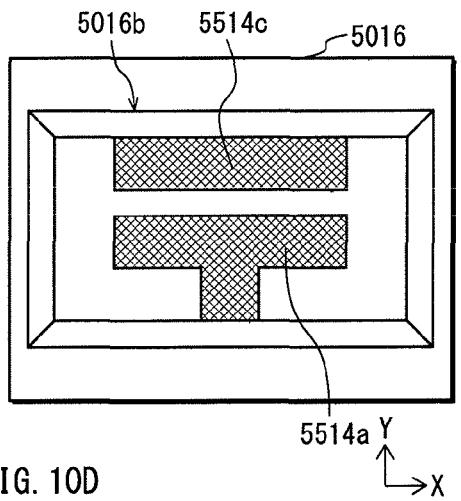
FIG. 10B is a schematic plan view illustrating, in a structure of an organic EL display panel pertaining to embodiment 6, a partial structure of a TFT substrate.

As illustrated in FIG. 10B, partition walls 5016 in the TFT substrate pertaining to the present embodiment defines an aperture 5016b. At a bottom portion of the aperture 5016b, a source electrode 5514a and a drain electrode 5514c are disposed. The source electrode 5514a has a T-shape in plan view, and the drain electrode 5514c has a rectangular shape in plan view. Further, in the aperture 5016b, a portion of the source electrode 5514a extending in the X axis direction faces a portion of the drain electrode 5514c extending in the X axis direction.

Further, at the bottom portion of the aperture 5016b, a center of a total of areas of the source electrode 5514a and the drain electrode 5514c is offset from a center of area of the bottom portion of the aperture 5016b in the upper direction along the Y axis. Due to such electrodes disposed in such an arrangement as described above being included in the TFT substrate pertaining to the present embodiment, a shape of a surface of semiconductor ink applied with respect to the aperture is controlled in a similar manner as in Claim 1. Hence, the organic semiconductor ink is prevented from overflowing and flowing out undesirably, and further, the meeting and blending of the semiconductor ink with semiconductor ink applied with respect to an adjacent aperture is prevented.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

Embodiment 7

In the following, description is provided on a structure of a TFT substrate pertaining to embodiment 7 of the present disclosure, with reference to FIG. 10C. Note that FIG. 10C is a diagram illustrating a portion of the TFT substrate pertaining to embodiment 7.

Figure 10C:
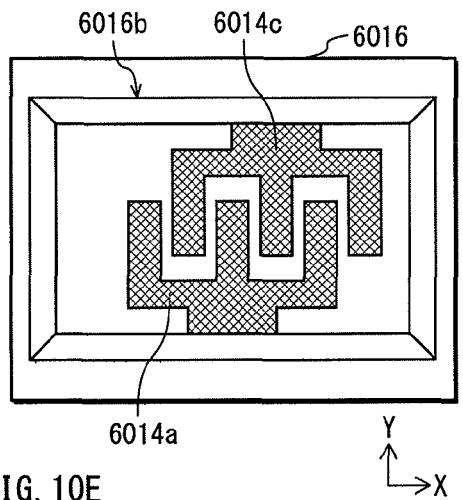
FIG. 10C is a schematic plan view illustrating, in a structure of an organic EL display panel pertaining to embodiment 7, a partial structure of a TFT substrate.

As illustrated in FIG. 10C, partition walls 6016 in the TFT substrate pertaining to the present embodiment defines an aperture 6016b. At a bottom portion of the aperture 6016b, a source electrode 6014a and a drain electrode 6014c are disposed. The source electrode 6014a and the drain electrode 6014c each have a comb shape in plan view and each have a comb-teeth portion. Further, in the aperture 6016b, the comb teeth portion of the source electrode 6014a faces the comb teeth portion of the drain electrode 6014c. Further, a center of a total of areas of the source electrode 6014a and the drain electrode 6014c at the bottom portion of the aperture 6016b is offset from a center of area of the bottom portion of the aperture 6016b in the right direction along the X axis.

Due to such electrodes disposed in such an arrangement as described above being included in the TFT substrate pertaining to the present embodiment, a shape of a surface of semiconductor ink applied with respect to the aperture is controlled in a similar manner as in Claim 1. Hence, the organic semiconductor ink is prevented from overflowing and flowing out undesirably, and further, the meeting and blending of the semiconductor ink with semiconductor ink applied with respect to an adjacent aperture is prevented.

The TFT substrate pertaining to the present embodiment, due to being provided with the structure described above, achieves the same effects as the structure described in embodiment 1.

In addition, according to the present embodiment, the source electrode 6014a and the drain electrode 6014 each have a comb shape, and further, the comb-teeth portion of the source electrode 6014a faces the comb-teeth portion of the drain electrode 6014c. As such, the areas of the electrodes facing the corresponding electrode increase, which leads to an improvement in transistor characteristics.

Embodiment 8

In the following, description is provided on a structure of a TFT substrate pertaining to embodiment 8 of the present disclosure, with reference to FIG. 10D. Note that FIG. 10D is a diagram illustrating a portion of the TFT substrate pertaining to embodiment 8.

Figure 10D:
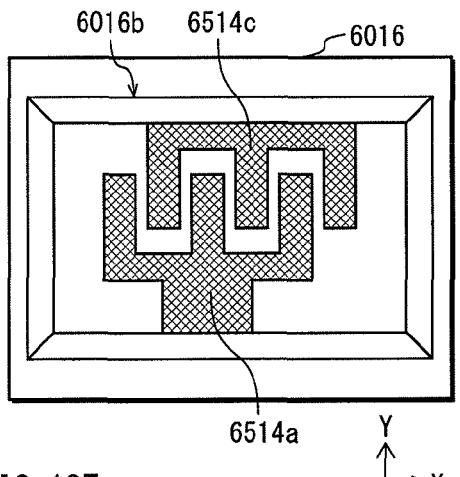
FIG. 10D is a schematic plan view illustrating, in a structure of an organic EL display panel pertaining to embodiment 8, a partial structure of a TFT substrate.

As illustrated in FIG. 10D, partition walls 6016 in the TFT substrate pertaining to the present embodiment defines an aperture 6016b. At a bottom portion of the aperture 6016b, a source electrode 6514a and a drain electrode 6514c are disposed. Similar as in embodiment 7, the source electrode 6514a and the drain electrode 6514c each have a comb shape in plan view and each have a comb-teeth portion. Further, in the aperture 6016b, the comb teeth portion of the source electrode 6514a faces the comb teeth portion of the drain electrode 6514c. Further, a center of a total of areas of the source electrode 6514a and the drain electrode 6514c at the bottom portion of the aperture 6016b is offset from a center of area of the bottom portion of the aperture 6016b in the upper direction along the Y axis.

Due to such electrodes disposed in such an arrangement as described above being included in the TFT substrate pertaining to the present embodiment, a shape of a surface of semiconductor ink applied with respect to the aperture is controlled in a similar manner as in Claim 1. Hence, the organic semiconductor ink is prevented from overflowing and flowing out undesirably, and further, the meeting and blending of the semiconductor ink with semiconductor ink applied with respect to an adjacent aperture is prevented.

The TFT substrate pertaining to the present embodiment, due to being provided with the structure described above, achieves the same effects as the structure described in embodiment 1.

In addition, according to the present embodiment, the source electrode 6514a and the drain electrode 6514c each have a comb shape, and further, the comb-teeth portion of the source electrode 6514a faces the comb-teeth portion of the drain electrode 6514c. As such, the areas of the electrodes facing the corresponding electrode increase, which leads to an improvement in transistor characteristics.

Embodiment 9

Figure 10E:
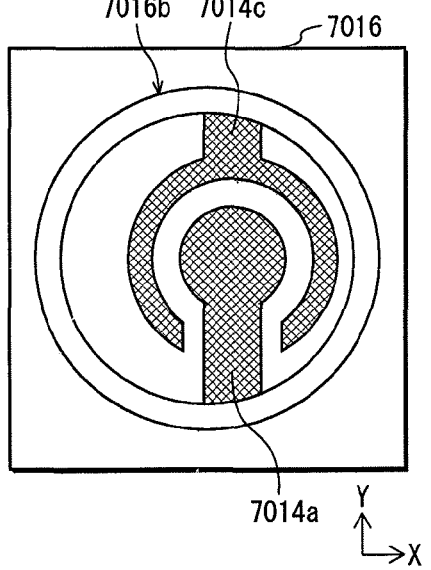
FIG. 10E is a schematic plan view illustrating, in a structure of an organic EL display panel pertaining to embodiment 9, a partial structure of a TFT substrate.

In the following, description is provided on a structure of a TFT substrate pertaining to embodiment 9 of the present disclosure, with reference to FIG. 10E. FIG. 10E corresponds to FIG. 3A in embodiment 1, and other than differences between the structures illustrated in FIG. 10E and FIG. 3A, embodiment 9 is similar to embodiments 1, 2, and 3. As such, the structures similar between embodiment 9 and embodiments 1, 2, and 3 are not illustrated in the drawings nor will be described in the following.

As illustrated in FIG. 10E, partition walls 7016 in the TFT substrate pertaining to the present embodiment defines an aperture 7016b. The aperture 7016b has an opening having a circular shape and has a bottom portion having a circular shape. At the bottom portion of the aperture 7016b, a source electrode 7014a and a drain electrode 7014c each having an outline of a circular shape or a shape of a circular arc are disposed.

Further, at the bottom portion of the aperture 7016b, each of the source electrode 7014a and the drain electrode 7014c is disposed so as to be offset such that a center of area thereof is offset in the right direction along the X axis from a center of area of the bottom portion of the aperture 7016b. Further, a center of a total of areas of the source electrode 7014a and the drain electrode 7014c at the bottom portion of the aperture 7016b is offset from the center of area of the bottom portion of the aperture 7016b in the right direction along the X axis.

In addition, similar as in the above, in the TFT substrate pertaining to the present embodiment, at the bottom portion of the aperture 7016b, each of the source electrode 7014a and the drain electrode 7014c is located apart from a side surface portion, of the partition walls 7016, facing the aperture 7016b at both sides (i.e., the right and left sides) thereof in the X axis direction.

In addition, at the bottom portion of the aperture 7016b before the formation of an organic semiconductor layer, a portion of an insulating layer remaining exposed occupies a greater area in the left side of the bottom portion in the X axis direction compared to in the right side, as illustrated in FIG. 10E.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

In addition, in the present embodiment, the source electrode 7014a and the drain electrode 7014c have the respective shapes as illustrated in FIG. 10E. As such, the areas of the electrodes facing the corresponding electrode increase, and further, a so-called "sneak current" is reduced.

Embodiment 10

In the following, description is provided on a structure of a TFT substrate pertaining to embodiment 10 of the present disclosure, with reference to FIG. 10F. Note that FIG. 10F is a diagram illustrating a portion of the TFT substrate pertaining to embodiment 10.

Figure 10F:
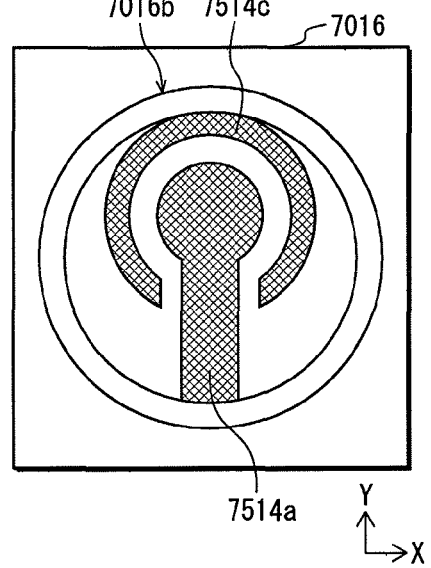
FIG. 10F is a schematic plan view illustrating, in a structure of an organic EL display panel pertaining to embodiment 10, a partial structure of a TFT substrate.

As illustrated in FIG. 10F, partition walls 7016 in the TFT substrate pertaining to the present embodiment defines an aperture 7016b. At a bottom portion of the aperture 7016b, a source electrode 7514a and a drain electrode 7514c are disposed. The shape of each of the source electrode 7514a and the drain electrode 7514c is similar as the shape of the corresponding electrode in embodiment 9.

In the present embodiment, a center of a total of areas of the source electrode 7514a and the drain electrode 7514c at the bottom portion of the aperture 7016b is offset from a center of area of the bottom portion of the aperture 7016b in the upper direction along the Y axis.

Due to such electrodes disposed in such an arrangement as described above being included in the TFT substrate pertaining to the present embodiment, a shape of a surface of semiconductor ink applied with respect to the aperture is controlled in a similar manner as in Claim 1. Hence, the organic semiconductor ink is prevented from overflowing and flowing out undesirably, and further, the meeting and blending of the semiconductor ink with semiconductor ink applied with respect to an adjacent aperture is prevented.

The TFT substrate pertaining to the present embodiment, due to being provided with the structure described above, achieves the same effects as the structure described in embodiment 1.

In addition, in the present embodiment, the source electrode 7514a and the drain electrode 7514c have the respective shapes as illustrated in FIG. 10F. As such, the areas of the electrodes facing the corresponding electrode increase, and further, a so-called "sneak current" is reduced, similar as in embodiment 9.

Embodiment 11

In the following, description is provided on a structure of a TFT substrate pertaining to embodiment 11 of the present disclosure, with reference to FIG. 11A. FIG. 11A corresponds to FIG. 3A in embodiment 1, and other than differences between the structures illustrated in FIG. 11A and FIG. 3A, embodiment 11 is similar to embodiments 1, 2, 3, etc. As such, the structures similar between embodiment 11 and embodiments 1, 2, 3, etc., are not illustrated in the drawings nor will be described in the following.

As illustrated in portion FIG. 11A, partition walls 8016 in the TFT substrate pertaining to the present embodiment define two apertures, namely apertures 8016a, 8016b. Further, each of the apertures 8016a, 8016b has an opening having a quadrilateral shape and a bottom portion having a quadrilateral shape, similar as in embodiment 1, etc. At the bottom portion of the aperture 8016a, a connection wire 8015 having a substantially square or rectangular shape is disposed. At the bottom portion of the aperture 8016b, a source electrode 8014a and a drain electrode 8014c each having a substantially square or rectangular shape are disposed.

Further, lengths in the X axis direction of the source electrode 8014a and the drain electrode 8014c disposed at the bottom portion of the aperture 8016b differ from each other. In addition, at the bottom portion of the aperture 8016b, the source electrodes 8014a is disposed such that a center of area thereof in the X axis direction substantially coincides with a line $L_1$ passing through a center of area of the bottom portion.

On the other hand, the drain electrode 8014c has a longer length in the X axis direction compared to the source electrode 8014a, and has a shape that the source electrode 8014a would exhibit when extended in the right direction along the X axis. Further, the drain electrode 8014c is disposed at the bottom portion of the aperture 8016b such that a center of area thereof is offset in the right direction along the X axis from the line $L_1$ passing through the center of area of the bottom portion. At the bottom portion of the aperture 8016b pertaining to the present embodiment, a line $L_2$ passing through a center of a total of areas of the source electrode 8014a and the drain electrode 8014c is offset in the right direction along the X axis from the line $L_1$ passing through the center of area of the bottom portion of the aperture 8016b in the X axis direction by a distance $x_2$.

In addition, in the TFT substrate pertaining to the present embodiment, at the bottom portion of the aperture 8016b, the source electrode 8014a is located apart from a side surface portion, of the partition walls 8016, facing the aperture 8016b at both sides thereof (the left and right sides) in the X axis direction. Further, at the bottom portion of the aperture 8016b, the drain electrode 8014c is located apart from the side surface portion facing the aperture 8016b at a left side thereof in the X axis direction while being in contact with the side surface portion facing the aperture 8016b at a right side thereof in the X axis direction.

In addition, at the bottom portion of the aperture 8016b before the formation of an organic semiconductor layer, a portion of an insulating layer 8013 remaining exposed (i.e., an exposed portion 8013a) occupies a greater area in the left side of the bottom portion in the X axis direction compared to in the right side, as illustrated in FIG. 11A.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

Embodiment 12

In the following, description is provided on a structure of a TFT substrate pertaining to embodiment 12 of the present disclosure, with reference to FIG. 11B. FIG. 11B corresponds to FIG. 3A in embodiment 1, and other than differences between the structures illustrated in FIG. 11B and FIG. 3A, embodiment 12 is similar to embodiment 1, etc. As such, the structures similar between embodiment 12 and embodiments 1, etc., are not illustrated in the drawings nor will be described in the following.

As illustrated in FIG. 11B, partition walls 8116 in the TFT substrate pertaining to the present embodiment defines two apertures, namely apertures 8116a, 8116b. Further, each of the apertures 8116a, 8116b has an opening having a quadrilateral shape and a bottom portion having a quadrilateral shape, similar as in embodiment 1, etc. At the bottom portion of the aperture 8116a, a connection wire 8115 having a substantially square shape is disposed. At the bottom portion of the aperture 8116b, a drain electrode 8114c having a rectangular shape is disposed.

On the other hand, a source electrode 8114a also disposed at the bottom portion of the aperture 8116b has a U-shape in plan view, and faces a part of the drain electrode 8114c at three sides thereof.

Further, at the bottom portion of the aperture 8116b, the source electrode 8114a is disposed such that a center of area of the source electrode 8114a is offset in the right direction along the X axis from a line $L_3$ passing through a center of area of the bottom portion of the aperture 8116b.

On the other hand, at the bottom portion of the aperture 8116b, the drain electrode 8114c is disposed such that a center of area thereof is offset in the left direction along the X axis from the line $L_3$ passing through the center of area of the bottom portion of the aperture 8116b.

At the bottom portion of the aperture 8116b pertaining to the present embodiment, a line $L_4$ passing through a center of a total of areas of the source electrode 8114a and the drain electrode 8114c is offset in the right direction along the X axis from the line $L_3$ passing through the center of area of the bottom portion of the aperture 8116b in the X axis direction by a distance $x_2$.

In addition, in the TFT substrate pertaining to the present embodiment, each of upper and lower portions of the source electrode 8114a in the Y axis direction and a right portion of the source electrode 8114a in the X axis direction are in contact with a side surface portion, of the partition walls 8116, facing the aperture 8116b while a left portion of the source electrode 8114a in the X axis direction is located apart from the side surface portion facing the aperture 8116b. On the other hand, a left portion of the drain electrode 8114c in the X axis direction is in contact with the side surface portion facing the aperture 8116b while a right portion of the drain electrode 8114c in the X axis direction is located apart from the side surface portion facing the aperture 8116b.

In addition, at the bottom portion of the aperture 8116b before the formation of an organic semiconductor layer, a portion of an insulating layer 8113 remaining exposed (i.e., an exposed portion 8113a) occupies a greater area in the left side of the bottom portion in the X axis direction compared to in the right side, as illustrated in FIG. 11B.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

Embodiment 13

In the following, description is provided on a structure of a TFT substrate pertaining to embodiment 13 of the present disclosure, with reference to FIG. 11C. FIG. 11C corresponds to FIG. 3A in embodiment 1, and other than differences between the structures illustrated in FIG. 11C and FIG. 3A, embodiment 13 is similar to embodiment 1, etc. As such, the structures similar between embodiment 13 and embodiments 1, etc., are not illustrated in the drawings nor will be described in the following.

As illustrated in FIG. 11C, partition walls 8216 in the TFT substrate pertaining to the present embodiment define two apertures, namely apertures 8216a, 8216b. Further, each of the apertures 8216a, 8216b has an opening having a quadrilateral shape and a bottom portion having a quadrilateral shape, similar as in embodiment 1, etc. At the bottom portion of the aperture 8216a, a connection wire 8215 having a substantially square shape is disposed. At the bottom portion of the aperture 8216b, a source electrode 8214a and a drain electrode 8214c each having a rectangular shape are disposed.

Further, at the bottom portion of the aperture 8216b, the source electrode 8214a is disposed such that a center of area of the source electrode 8214a is offset in the right direction along the X axis from a line $L_5$ passing through a center of area of the bottom portion of the aperture 8216b.

On the other hand, at the bottom portion of the aperture 8216b, the drain electrode 8214c is disposed such that a center of area thereof is offset in the left direction along the X axis from the line $L_5$ passing through the center of area of the bottom portion of the aperture 8216b.

At the bottom portion of the aperture 8216b pertaining to the present embodiment, a line $L_6$ passing through a center of a total of areas of the source electrode 8214a and the drain electrode 8214c is offset in the right direction along the X axis from the line $L_5$ passing through the center of area of the bottom portion of the aperture 8216b in the X axis direction by a distance $x_3$.

In addition, in the TFT substrate pertaining to the present embodiment, each of upper and lower portions of the source electrode 8214a in the Y axis direction and a right portion of the source electrode 8214a in the X axis direction are in contact with a side surface portion, of the partition walls 8216, facing the aperture 8216b while a left portion of the source electrode 8214a in the X axis direction is located apart from the side surface portion facing the aperture 8216b. On the other hand, upper and lower portions of the drain electrode 8214c in the Y axis direction are in contact with the side surface portion facing the aperture 8216b while both portions of the drain electrode 8214c in the X axis direction are located apart from the side surface portion facing the aperture 8216b.

In addition, at the bottom portion of the aperture 8216b before the formation of an organic semiconductor layer, a portion of an insulating layer 8213 remaining exposed (i.e., an exposed portion 8213a) occupies a greater area in the left side of the bottom portion in the X axis direction compared to in the right side, as illustrated in FIG. 11C.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

Embodiment 14

In the following, description is provided on a structure of a TFT substrate pertaining to embodiment 14 of the present disclosure, with reference to FIG. 12A. Note that FIG. 12A is a diagram illustrating a portion of the TFT substrate pertaining to embodiment 14.

Figure 12A:
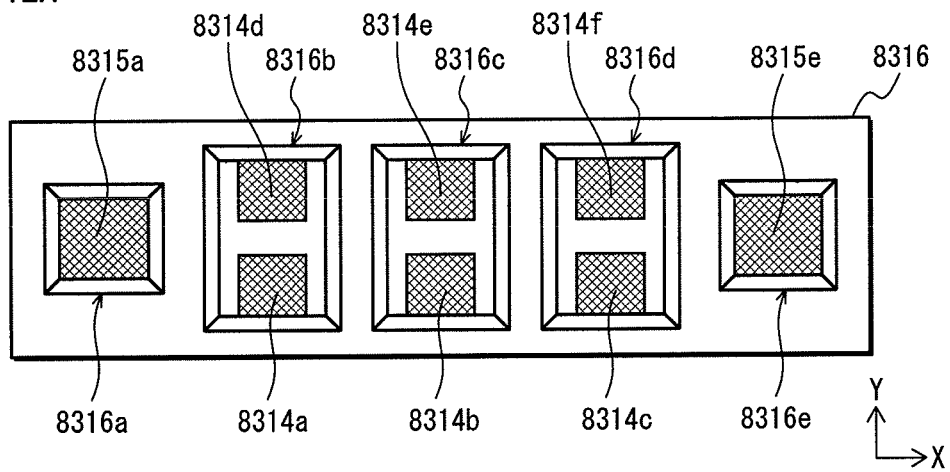
FIG. 12A is a schematic plan view illustrating, in a structure of an organic EL display panel pertaining to embodiment 14, a partial structure of a TFT substrate.

As illustrated in FIG. 12A, the TFT substrate pertaining to the present embodiment has partition walls 8316 that define five apertures, namely apertures 8316a, 8316b, 8316c, 8316d, 8316e. Among the five apertures that are defined by the partition walls 8316, the apertures 8316a, 8316e are respectively provided with connection wires 8315a, 8315e at bottom portions thereof, and thus, do not function as channel portions.

Note that, as illustrated in FIG. 12A, one of the apertures 8316a, 8316e, which do not function as channel portions, here for instance, the aperture 8316e belongs to a TFT element that corresponds to a subpixel adjacent to a subpixel that the apertures 8316a through 8316d correspond to. This is similar as already described above.

In the present embodiment, the apertures 8316b, 8316c, 8316d, which are disposed between the apertures 8316a, 8316e, are disposed with gaps therebetween. Further, at a bottom portion of each of the apertures 8316b, 8316c, 8316d, a corresponding one of source electrodes 8314a, 8314b, 8314c and a corresponding one of drain electrodes 8314d, 8314e, 8314f are disposed. Further, an undepicted organic semiconductor layer is formed with respect to each of the apertures 8316b, 8316c, 8316d. Hence, the apertures 8316b, 8316c, 8316d are portions that function as channel portions.

In each of the apertures 8316b, 8316c, 8316d, the corresponding one of the source electrodes 8314a, 8314b, 8314c is disposed at a lower side of the aperture in the Y axis direction, and the corresponding one of the drain electrodes 8314d, 8314e, 8314f is disposed at an upper side of the aperture in the Y axis direction. In addition, in each of the apertures 8316b, 8316c, 8316d, the corresponding one of the source electrodes 8314a, 8314b, 8314c is in contact with a side surface portion of the partition walls 8316 facing the aperture at a lower side thereof in the Y axis direction while being located apart from the side surface portion at other sides thereof. Similarly, in each of the apertures 8316b, 8316c, 8316d, the corresponding one of the drain electrodes 8314d, 8314e, 8314f is in contact with the side surface portion facing the aperture at an upper side thereof in the Y axis direction while being located apart from the side surface portion at other sides thereof.

When organic semiconductor ink is applied with respect to the apertures 8316b, 8316c, 8316d having the above-described structures, a surface of the organic semiconductor ink applied with respect to each of the apertures 8316b, 8316c, 8316d exhibits a shape of being biased in the upper and lower directions along the Y axis.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

Embodiment 15

In the following, description is provided on a structure of a TFT substrate pertaining to embodiment 15 of the present disclosure, with reference to FIG. 12B. Note that FIG. 12B is a diagram illustrating a portion of the TFT substrate pertaining to embodiment 15.

Figure 12B:
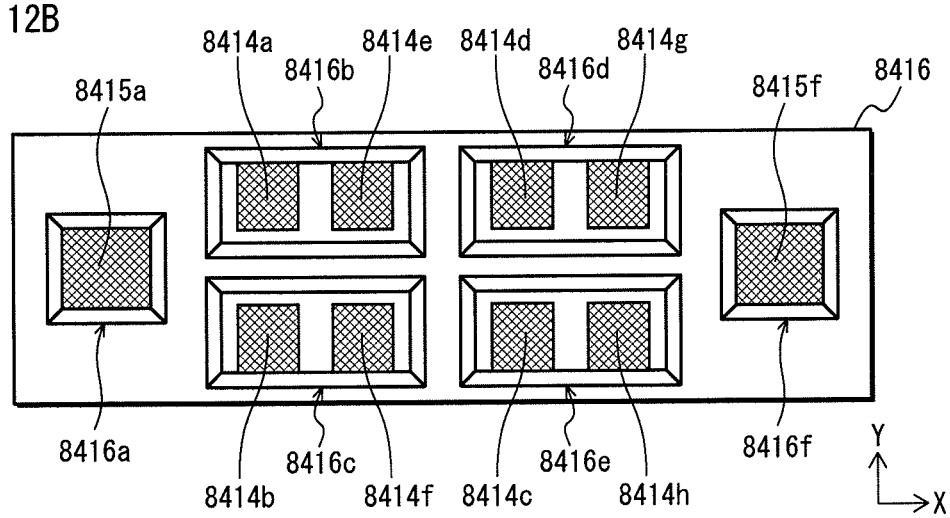
FIG. 12B is a schematic plan view illustrating, in a structure of an organic EL display panel pertaining to embodiment 15, a partial structure of a TFT substrate.

As illustrated in FIG. 12B, the TFT substrate pertaining to the present embodiment has partition walls 8416 that define six apertures, namely apertures 8416a, 8416b, 8416c, 8416d, 8416e, 8416f. Among the six apertures that are defined by the partition walls 8416, the apertures 8416a, 8416f are respectively provided with connection wires 8415a, 8415f at bottom portions thereof, and thus, do not function as channel portions.

Note that, as illustrated in FIG. 12B, one of the apertures 8416a, 8416f, which do not function as channel portions, here for instance, the aperture 8416f belongs to a TFT element that corresponds to a subpixel adjacent to a subpixel that the apertures 8416a through 8416e correspond to. This is similar as described above.

In the present embodiment, the four apertures 8416b, 8416c, 8416d, 8416e are disposed in the form of a matrix between the apertures 8416a, 8416f and with gaps therebetween. Further, at a bottom portion of each of the apertures 8416b, 8416c, 8416d, 8416e, a corresponding one of source electrodes 8414a, 8414b, 8414c, 8414d and a corresponding one of drain electrodes 8414e, 8414f, 8414g, 8414h are disposed. Further, an undepicted organic semiconductor layer is formed with respect to each of the apertures 8416b, 8416c, 8416d, 8416e. Hence, the apertures 8416b, 8416c, 8416d, 8416e are portions that function as channel portions.

In each of the apertures 8416b, 8416c, 8416d, 8416e, the corresponding one of the source electrodes 8414a, 8414b, 8414c, 8414d is disposed at a left side of the aperture in the X axis direction, and the corresponding one of the drain electrodes 8414e, 8414f, 8414g, 8414h is disposed at a right side of the aperture in the X axis direction. In addition, in each of the apertures 8416b, 8416c, 8416d, 8416e, the corresponding one of the source electrodes 8414a, 8414b, 8414c, 8414d is in contact with a side surface portion of the partition walls 8416 facing the aperture at either an upper side or a lower side thereof in the Y axis direction while being located apart from the side surface portion at other sides thereof. Similarly, in each of the apertures 8416b, 8416c, 8416d, 8416e, the corresponding one of the drain electrodes 8414e, 8414f, 8414g, 8414h is in contact with the side surface portion facing the aperture at the same side in the Y axis direction as the corresponding source electrode while being located apart from the side surface portion at other sides thereof.

When organic semiconductor ink is applied with respect to the apertures 8416b, 8416c, 8416d, 8416e having the above-described structures, a surface of the organic semiconductor ink applied with respect to each of the apertures 8416b, 8416d exhibits a shape of being biased in the upper direction along the Y axis while a surface of the organic semiconductor ink applied with respect to each of the apertures 8416c, 8416e exhibits a shape of being biased in the lower direction along the Y axis.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

Embodiment 16

In the following, description is provided on a structure of a TFT substrate pertaining to embodiment 16 of the present disclosure, with reference to FIG. 12C. Note that FIG. 12C is a diagram illustrating a portion of the TFT substrate pertaining to embodiment 16.

Figure 12C:
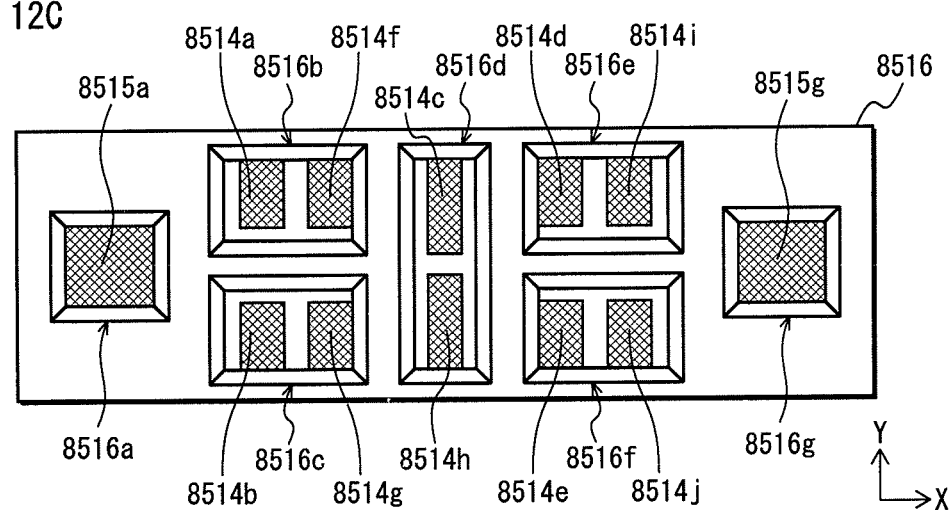
FIG. 12C is a schematic plan view illustrating, in a structure of an organic EL display panel pertaining to embodiment 16, a partial structure of a TFT substrate.

As illustrated in FIG. 12C, the TFT substrate pertaining to the present embodiment has partition walls 8516 that define seven apertures, namely apertures 8516*a*, 8516*b*, 8516*c*, 8516*d*, 8516*e*, 8516*f*, 8516*g*. Among the seven apertures that are defined by the partition walls 8516, the apertures 8516*a*, 8516*g* are respectively provided with connection wires 8515*a*, 8415*fg* at bottom portions thereof, and thus, do not function as channel portions.

Note that, as illustrated in FIG. 12C, one of the apertures 8516*a*, 8516*g*, which do not function as channel portions, here for instance, the aperture 8516*g* belongs to a TFT element that corresponds to a subpixel adjacent to a subpixel that the apertures 8516*a* through 8516*f* correspond to. This is similar as described above.

In the present embodiment, the five apertures 8516*b*, 8516*c*, 8516*d*, 8516*e*, 8516*f* are disposed between the apertures 8516*a*, 8516*g* and with gaps therebetween. Further, at a bottom portion of each of the apertures 8516*b*, 8516*c*, 8516*d*, 8516*e*, 8516*f*, a corresponding one of source electrodes 8514*a*, 8514*b*, 8514*c*, 8514*d*, 8514*e* and a corresponding one of drain electrodes 8514*f*, 8514*g*, 8514*h*, 8514*i*, 8514*j* are disposed. Further, an undepicted organic semiconductor layer is formed with respect to each of the apertures 8516*b*, 8516*c*, 8516*d*, 8516*e*, 8516*f*. Hence, the apertures 8516*b*, 8516*c*, 8516*d*, 8516*e*, 8516*f* are portions that function as channel portions.

In each of the apertures 8516*b*, 8516*c*, 8516*e*, 8516*f*, the corresponding one of the source electrodes 8514*a*, 8514*b*, 8514*d*, 8514*e* is disposed at a left side of the aperture in the X axis direction, and the corresponding one of the drain electrodes 8514*f*, 8514*g*, 8514*i*, 8514*j* is disposed at a right side of the aperture in the X axis direction. In the aperture 8516*d*, the source electrode 8514*c* is disposed at an upper side of the aperture in the Y axis direction and the drain electrode 8514*h* is disposed at a lower side of the aperture in the Y axis direction. In addition, each of the electrodes 8514*a*, 8514*b*, 8514*c*, 8514*h*, 8514*i*, 8514*j* is in contact with a side surface portion, of the partition walls 8516, facing the corresponding one of the apertures 8516*b*, 8516*c*, 8516*d*, 8516*e*, 8516*f* at either an upper side or a lower side thereof in the Y axis direction while being located apart from the side surface portion at other sides thereof. On the other hand, each of the electrodes 8514*d*, 8514*e*, 8514*f*, 8514*g* is in contact with the side surface portion, of the partition walls 8516, facing the corresponding one of the apertures 8516*b*, 8516*c*, 8516*e*, 8516*f* at either a right side or a left side thereof in the X axis direction in addition to being in contact with the side surface portion at either an upper side or a lower side thereof in the Y was direction. Further, each of the electrodes 8514*d*, 8514*e*, 8514*f*, 8514*g* is located apart from the side surface portion at other sides thereof.

When organic semiconductor ink is applied with respect to the apertures 8516*b*, 8516*c*, 8516*d*, 8516*e* having the above-described structures, a surface of the organic semiconductor ink applied with respect to each of the apertures 8516*b*, 8516*e* exhibits a shape of being biased in the upper direction along the Y axis while a surface of the organic semiconductor ink applied with respect to each of the apertures 8516*c*, 8516*f* exhibits a shape of being biased in the lower direction along the Y axis. In addition, the surface of the organic semiconductor ink applied with respect to each of the apertures 8516*b*, 8516*e* is also biased in the right direction along the X axis, and the surface of the organic semiconductor ink applied with respect to each of the apertures 8516*c*, 8516*f* is also biased in the left direction along the X axis.

Further, when organic semiconductor ink is applied with respect to the aperture 8516*d* having the above-described structures, a surface of the organic semiconductor ink applied with respect to the aperture 8516*d* exhibits a shape of being biased in the upper and lower directions along the Y axis.

The TFT substrate pertaining to the present embodiment, due to being provided with the structure described above, achieves the same effects as the structure described in embodiment 1. In addition, similar as described in embodiment 1 above, an organic EL display panel and an organic EL display device including the TFT substrate pertaining to the present embodiment are ensured to have high quality, and at the same time, to have high yield in the manufacture thereof.

[Other Matters]

In some of the above-described embodiments 1 through 16, description has been provided of examples where, within one side of an aperture in a direction of an adjacent aperture, a portion exists where a source electrode nor a drain electrode exists and thus, where an insulating layer is in direct contact with an organic semiconductor layer. However, the one side may include a portion of the source electrode and/or a portion of the drain electrode, provided that an area of an exposed portion of the insulating layer at each of the sides be determined in relation with a shape to be exhibited by a surface of semiconductor ink applied with respect to the aperture at each of the sides.

In the above-described embodiments 1 through 16, description has been provided by taking as an example a TFT substrate to be used in the organic EL display panel 10. However, the TFT substrate may alternatively be used in a liquid crystal display panel, a field emission display panel, etc. Further, the TFT substrate may also be used in an electronic paper, etc.

In addition, the materials described in the above-described embodiments are mere examples of such materials that may be used. As such, other materials may be used as necessary.

In addition, as illustrated in FIG. 2, the organic EL display panel 10 pertaining to embodiment 1 is a top-emission type organic EL display panel. However, the organic EL display panel may alternatively be a bottom-emission type organic EL display panel. In such a case, the materials to be used for forming the organic EL display panel and the layout design of the organic EL display panel may be changed as necessary.

Figure 13A:
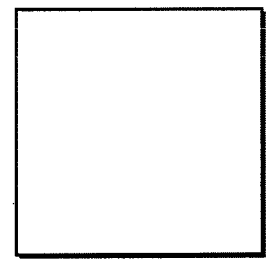
FIG. 13A is a schematic plan view illustrating a shape of an opening of an aperture defined by partition walls in a TFT substrate pertaining to modification 1.
Figure 13B:
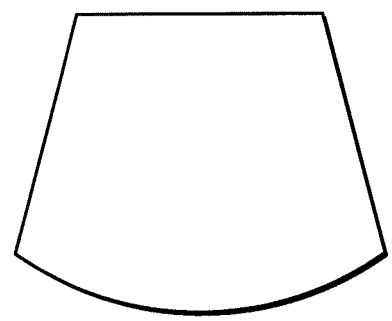
FIG. 13B is a schematic plan view illustrating a shape of an opening of an aperture defined by partitions wall in a TFT substrate pertaining to modification 2.
Figure 13C:
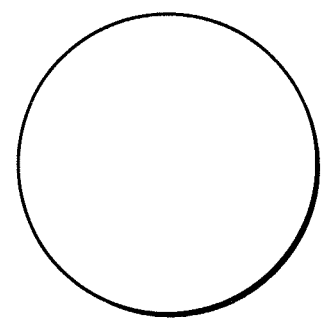
FIG. 13C is a schematic plan view illustrating a shape of an opening of an aperture defined by partition walls in a TFT substrate pertaining to modification 3.

In addition, in the above, description has been provided that the apertures defined by the partition walls each have an opening having a rectangular shape or a substantially circular shape. However, the apertures defined by the partition walls may alternatively have openings of various shapes. For instance, an aperture may have an opening having a square shape as illustrated in FIG. 13A, or may have an opening having a shape as illustrated in FIG. 13B composed of one side being a circular arc and three remaining sides being straight lines. In addition, an aperture may have an opening having a circular shape as illustrated in FIG. 13C, and another aperture having the shape of a circular arc may be provided so as to partially surround the circular aperture. Needless to say, the shape of an opening of an aperture corresponding to a channel portion and the shape of an opening of an aperture corresponding to a non-channel portion are interchangeable.

In addition, in the above, description has been provided that the outflow of organic semiconductor ink toward an aperture to come in contact with an anode or the like is undesirable, and thus should be prevented. However, the outflow of organic semiconductor ink to other types of apertures may alternatively be prevented. For instance, the outflow of organic semiconductor ink towards a "repair aperture" may be prevented. Here, the repair aperture refers to an aperture that is used when a defect is found in a TFT device having been formed and the TFT device is repaired by newly forming a TFT element only with respect to a cell having a defect.

Further, in cases such as where great stress is exerted on partition walls in a TFT substrate, holes may be formed in the partition walls in order to relieve the stress exerted on the partition walls. In such cases, it is desirable that configuration be made such that organic semiconductor ink is prevented from flowing out towards the holes formed in the partition walls in order to relieve the stress exerted on the partition walls. Note that, although the formation of organic semiconductor layers with respect to the above-described holes formed in the partition walls is not problematic by itself, a problem arises when organic semiconductor ink flow out towards such holes formed in the partition walls since the amount of organic semiconductor ink remaining at areas at which the formation of organic semiconductor layers is desired decreases. As such, the outflow of organic semiconductor ink towards the above-described holes is undesirable since the control of the layer thicknesses of the organic semiconductor layers would become difficult. In other words, the outflow of organic semiconductor ink towards such holes formed in the partition walls may affect TFT performance. As such, it is desirable that measures be taken so as to prevent organic semiconductor ink from flowing out towards the above-described holes formed in the partition walls in order to relieve the stress exerted on the partition walls.

In addition, description has been provided in the above on a structure including an organic semiconductor layer formed by using organic semiconductor ink. However, a similar structure may alternatively be used for a structure including an inorganic semiconductor layer formed by using inorganic semiconductor ink. In such a case, the same effects as described above can be achieved. For instance, an amorphous metal oxide semiconductor may be used as the inorganic semiconductor material. It is expected for such semiconductors to be applied to displays, electronic papers, etc., for the transparency possessed thereby.

In terms of mobility, such semiconductors are materials that may potentially realize a movability of 3 to 20 $cm^2/Vs$, which is desirable in high performance LCD and organic electro-luminescence (EL) displays.

Some commonly-known, representative examples of an amorphous metal oxide semiconductor include an amorphous indium zinc oxide semiconductor (a-InZnO) containing indium (In) and zinc (Zn) and an amorphous indium gallium zinc oxide semiconductor (a-InGaZnO), which includes gallium (Ga) as a metal component in addition to indium (In) and zinc (Zn).

For details concerning such inorganic semiconductors, reference may be made to disclosure in International Application No. WO 2012/035281.

In the above, description has been provided on a structure in which the outflow of organic semiconductor ink towards a specific aperture is undesirable, and thus prevented. However, application to a structure not including such an aperture is also possible. In specific, in a structure where two or more apertures with respect to which organic semiconductor layers are to be formed are arranged adjacent to each other, partition walls may be formed such that organic semiconductor ink does not flow out from one aperture towards another. By forming such partition walls, the formation of the organic semiconductor layers can be performed while it is ensured that organic semiconductor ink for forming one organic semiconductor layer exists separately from organic semiconductor ink for forming the other organic semiconductor layer. As such, as compared to a case where the formation of organic semiconductor layers is performed while applied organic semiconductor ink covers two adjacent apertures and the gap therebetween, it is easier to reduce the difference between layer thickness of an organic semiconductor layer to be formed with respect to one aperture and layer thickness of another organic semiconductor layer to be formed with respect to an adjacent aperture, and as a result, excellent semiconductor characteristics and an improvement in yield can be expected.

INDUSTRIAL APPLICABILITY

The invention disclosed in the present disclosure is applicable to a display device provided with a panel, such as an organic EL display panel, and is useful for realizing a TFT device having high quality by realizing high-definition.

REFERENCE SIGNS LIST 1 organic EL display device
10 organic EL display panel
20 drive control circuit portion
21-24 drive circuit
25 control circuit
101 TFT substrate
102 planarizing film
102a contact hole
103 anode
104 light-transmissive conduction film
105 hole injection layer
106 bank
107 hole transport layer
108 organic light-emitting layer
109 electron transport layer
110 cathode
111 sealing layer
112 adhesion layer
113 CF substrate
501 mask
1011, 1131 CF substrate
1012a, 1012b gate electrode
1013 insulating layer
1014a, 1014b, 2014a, 2014b, 3014a, 3014b, 4014a, 4014b, 5014a, 5514a, 6014a, 6514a, 7014a, 7514a, 8014a, 8114a, 8214a, 8314a, 8314b, 8314c, 8414a, 8414b, 8414c, 8414d, 8514a, 8514b, 8514c, 8514d, 8514e source electrode
1014c, 1014d, 2014c, 2014d, 3014c, 3014d, 4014c, 4014d, 5014c, 5514c, 6014c, 6514c, 7014c, 7514c, 8014c, 8114c, 8214c, 8314d, 8314e, 8314f, 8414e, 8414f, 8414g, 8414h, 8514f, 8514g, 8514h, 8514i, 8514j drain electrode
1015, 2015a, 2015d, 3015a, 3015d, 4015a, 4015d, 8015, 8115, 8215, 8315a, 8315e, 8415a, 8415f, 8515a, 8515g connection wire
1016, 2016, 3016, 4016, 5016, 6016, 7016, 8016, 8116, 8216, 8316, 8416, 8516 partition walls
1016a, 1016b, 1016c, 2616a, 2016b, 2016c, 2016d, 3016a, 3016b, 3016c, 3016d, 4016a, 4016b, 4016c, 4016d, 5016b, 6016b, 7016b, 8016a, 8016b, 8116a, 8116b, 8216a, 8216b, 8316a, 8316b, 8316c, 8316d, 8316e, 8416a, 8416b, 8416c, 8416d, 8416e, 8416f, 8516a, 8516b, 8516c, 8516d, 8516e, 8516f, 8516g aperture
1017a, 1017b organic semiconductor layer
1018 passivation film
1132 color filter
1133 black matrix
10160 photoresist material film
10170a, 10170b organic semiconductor ink

The invention claimed is:

1. A thin film transistor device comprising:
a first thin film transistor element and a second thin film transistor element that are positioned adjacent to each other with a gap therebetween, wherein
each of the first thin film transistor element and the second thin film transistor element comprises:
a gate electrode;
an insulating layer disposed on the gate electrode;
a source electrode and a drain electrode disposed on the insulating layer with a gap therebetween; and
a semiconductor layer that is disposed on the source electrode and the drain electrode to cover the source electrode and the drain electrode and fill the gap between the source electrode and the drain electrode, and that is in contact with the source electrode and the drain electrode, wherein
the thin film transistor device further comprises partition walls that are disposed on the insulating layer and partition the semiconductor layer of the first thin film transistor element from the semiconductor layer of the second thin film transistor element, the partition walls having liquid-repellant surfaces and defining a first aperture, a second aperture, and a third aperture,
the first aperture surrounds at least a part of each of the source electrode and the drain electrode of the first thin film transistor element,
the second aperture is adjacent to the first aperture and surrounds at least a part of each of the source electrode and the drain electrode of the second thin film transistor element,
the third aperture is adjacent to the first aperture with a gap therebetween and is positioned in a direction, from the first aperture, differing from a direction in which the second aperture is positioned with respect to the first aperture,
an area of the thin film transistor device in the third aperture does not include a semiconductor layer and does not function as a channel portion of the thin film transistor device,
a bottom portion of each of the first and second apertures includes a source electrode portion, which is a bottom portion of the source electrode, and a drain electrode portion, which is a bottom portion of the drain electrode,
in a plan view, at the bottom portion of the first aperture, a center of a total of areas of the source electrode portion and the drain electrode portion is offset from a center of an area of the bottom portion of the first aperture in a direction differing from the direction in which the third aperture is positioned with respect to the first aperture, and
in the plan view, at the bottom portion of one of the first and second apertures, a center of a total of areas of the source electrode portion and the drain electrode portion is offset from a center of an area of the bottom portion of the one of the first and second apertures in a direction differing from a direction in which the other one of the first and second apertures is positioned with respect to the one of the first and second apertures.

2. The thin film transistor device of claim 1, wherein
the bottom portion of the first aperture includes a first portion where the source electrode portion and the drain electrode portion are not present and where the insulating layer of the first thin film transistor element is in direct contact with the semiconductor layer of the first thin film transistor element, wherein the first portion is located at an end of the bottom portion of the first aperture in the direction in which the third aperture is positioned with respect to the first aperture.

3. The thin film transistor device of claim 2, wherein
the bottom portion of the first aperture further includes a second portion where the source electrode portion and the drain electrode portion are not present and where the insulating layer of the first thin film transistor element is in direct contact with the semiconductor layer of the first thin film transistor element, wherein the second portion is located at an end of the bottom portion of the first aperture in the direction differing from the direction in which the third aperture is positioned with respect to the first aperture, and
in the plan view of the bottom portion of the first aperture, an area of the first portion is greater than an area of the second portion.

4. The thin film transistor device of claim 1, wherein
in the plan view, at the bottom portion of the other one of the first and second apertures, a center of a total of areas of the source electrode portion and the drain electrode portion is offset from a center of area of the bottom portion of the other one of the first and second apertures in the direction differing from the direction in which the one of the first and second apertures is positioned with respect to the other one of the first and second apertures.

5. The thin film transistor device of claim 1, wherein
in the plan view of the first, second, and third apertures,
the third aperture, the first aperture, and the second aperture are arranged in series in the stated order along a predetermined direction,
at the bottom portion of the first aperture, the center of the total of areas of the source electrode portion and the drain electrode portion is offset from the center of the area of the bottom portion of the first aperture in a first direction that intersects the predetermined direction, and
at the bottom portion of the second aperture, a center of a total of areas of the source electrode portion and the drain electrode portion is offset from a center of an area of the bottom portion of the second aperture in a second direction that intersects the predetermined direction.

6. The thin film transistor device of claim 5, wherein
the first direction and the second direction are opposite directions.

7. The thin film transistor device of claim 1, wherein
in the plan view of the bottom portion of the first aperture,
a center of an area of one of the source electrode portion and the drain electrode portion is offset from the center of the area of the bottom portion of the first aperture in the direction differing from the direction in which the third aperture is positioned with respect to the first aperture, and
a center of an area of the other one of the source electrode portion and the drain electrode portion coincides with the center of the area of the bottom portion of the first aperture.

8. The thin film transistor device of claim 1, wherein
in the plan view of the bottom portion of the first aperture,
a center of an area of each of the source electrode portion and the drain electrode portion is offset from the center of the area of the bottom portion of the first aperture in the direction differing from the direction in which the third aperture is positioned with respect to the first aperture.

9. The thin film transistor device of claim 1, wherein
at the bottom portion of the first aperture,
at least one of the source electrode portion and the drain electrode portion is spaced from a first side surface of the partition walls, and is in contact with a second side surface of the partition walls, the first side surface facing the first aperture and being located in the direction in which the third aperture is positioned with respect to the first aperture, the second side surface facing the first aperture and being located in a direction differing from the direction in which the third aperture is positioned with respect to the first aperture, and at the bottom portion of the one of the first and second apertures, at least one of the source electrode portion and the drain electrode portion is spaced from a third side surface of the partition walls, and is in contact with a fourth side surface of the partition walls, the third side surface facing the one of the first and second apertures and being located in the direction in which the other one of the first and second apertures is positioned with respect the one of the first and second apertures, the fourth side surface facing the one of the first and second apertures and being located in the direction differing from the direction in which the other one of the first and second apertures is positioned with respect to the one of the first and second apertures.

10. The thin film transistor device of claim 1, wherein a liquid repellency of the surfaces of the partition walls is greater than a liquid repellency of a surface of the insulating layer, in each of the first and second thin film transistor elements, that is in contact with the semiconductor layer, and the liquid repellency of the surface of the insulating layer, in each of the first and second thin film transistor elements, that is in contact with the semiconductor layer is greater than a liquid repellency of a surface of each of the source electrode and the drain electrode in each of the first and second thin film transistor elements.

11. The thin film transistor device of claim 1, wherein a bottom portion of the third aperture includes a connection wire for electrically connecting with one of the source electrode and the drain electrode in the first thin film transistor element or one of the source electrode and the drain electrode in the second thin film transistor element.

12. An organic EL display element comprising:

the thin film transistor device of claim 1;

a planarizing film that is provided above the thin film transistor device and includes a contact hole;

a lower electrode that is provided on the planarizing film to cover the planarizing film and a side surface of the planarizing film defining the contact hole, and is electrically connected with one of the source electrode and the drain electrode in the first thin film transistor element or one of the source electrode and the drain electrode in the second thin film transistor element;

an upper electrode provided above the lower electrode; and an organic light-emitting layer interposed between the lower electrode and the upper electrode, wherein the contact hole is in communication with the third aperture of the thin film transistor device.

13. An organic EL display device comprising the organic EL display element of claim 12.

* * * * *